(12) United States Patent
Korenaga

(10) Patent No.: US 7,508,099 B2
(45) Date of Patent: Mar. 24, 2009

(54) DRIVING APPARATUS, EXPOSURE APPARATUS, AND DEVICE MANUFACTURING METHOD

(75) Inventor: Nobushige Korenaga, Utsunomiya (JP)

(73) Assignee: Canon Kabushiki Kaisha, Tokyo (JP)

( * ) Notice: Subject to any disclaimer, the term of this patent is extended or adjusted under 35 U.S.C. 154(b) by 159 days.

(21) Appl. No.: 11/746,797

(22) Filed: May 10, 2007

(65) Prior Publication Data

US 2007/0267920 A1    Nov. 22, 2007

(30) Foreign Application Priority Data

May 18, 2006    (JP) .............................. 2006-139465

(51) Int. Cl.
*H02K 41/00*    (2006.01)
(52) U.S. Cl. .............................. 310/12; 355/53; 355/72
(58) Field of Classification Search ................... 310/12; 355/53, 72
See application file for complete search history.

(56) References Cited

U.S. PATENT DOCUMENTS

| | | | | |
|---|---|---|---|---|
| 5,763,965 | A * | 6/1998 | Bader | 310/12 |
| 5,841,250 | A | 11/1998 | Korenaga et al. | 318/135 |
| 6,037,680 | A | 3/2000 | Korenaga et al. | 310/12 |
| 6,107,703 | A | 8/2000 | Korenaga | 310/12 |
| 6,265,793 | B1 | 7/2001 | Korenaga | 310/12 |
| 6,417,914 | B1 * | 7/2002 | Li | 355/75 |
| 6,479,991 | B1 | 11/2002 | Korenaga | 324/226 |
| 6,665,053 | B2 | 12/2003 | Korenaga | 355/72 |
| 6,841,956 | B2 * | 1/2005 | Hazelton et al. | 318/135 |
| 6,859,257 | B2 | 2/2005 | Korenaga | 355/53 |
| 6,864,602 | B2 | 3/2005 | Korenaga | 310/12 |
| 6,873,404 | B2 | 3/2005 | Korenaga | 355/72 |
| 6,903,468 | B2 | 6/2005 | Korenaga | 310/12 |
| 6,946,757 | B2 | 9/2005 | Korenaga | 310/12 |
| 6,954,041 | B2 | 10/2005 | Korenaga | 318/135 |
| 6,987,335 | B2 | 1/2006 | Korenaga | |
| 7,030,964 | B2 | 4/2006 | Akutsu et al. | 355/53 |
| 7,067,942 | B2 | 6/2006 | Korenaga et al. | 310/12 |
| 7,075,197 | B2 | 7/2006 | Korenaga | 310/12 |
| 7,075,198 | B2 | 7/2006 | Korenaga | |
| 7,227,284 | B2 | 6/2007 | Korenaga | 310/12 |
| 7,282,819 | B2 | 10/2007 | Korenaga | 310/12 |
| 2005/0248219 | A1 * | 11/2005 | Korenaga | 310/12 |
| 2006/0202568 | A1 | 9/2006 | Korenaga | 310/12 |
| 2006/0214519 | A1 | 9/2006 | Korenaga | |

FOREIGN PATENT DOCUMENTS

JP    2004-254489    9/2004

* cited by examiner

*Primary Examiner*—Michael C Zarroli
(74) *Attorney, Agent, or Firm*—Fitzpatrick, Cella, Harper & Scinto

(57) ABSTRACT

A driving apparatus which comprises a stator and two movable elements. The stator includes a first area and a second area. The movable elements can move on the stator. The movable elements include magnets, while the stator includes a coil unit. The coil unit includes a driving coil which independently drives the two movable elements within the first area and the second area, and a swap coil which swaps the two movable elements between the first area and the second area. The coil unit is configured such that the swap coil and at least part of the driving coil are superimposed on each other.

12 Claims, 20 Drawing Sheets

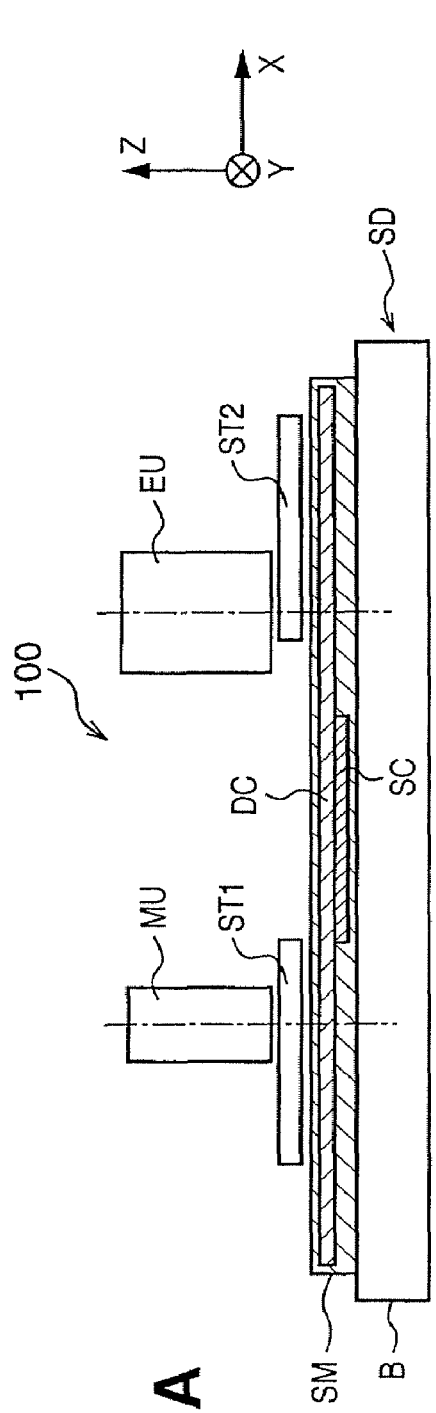
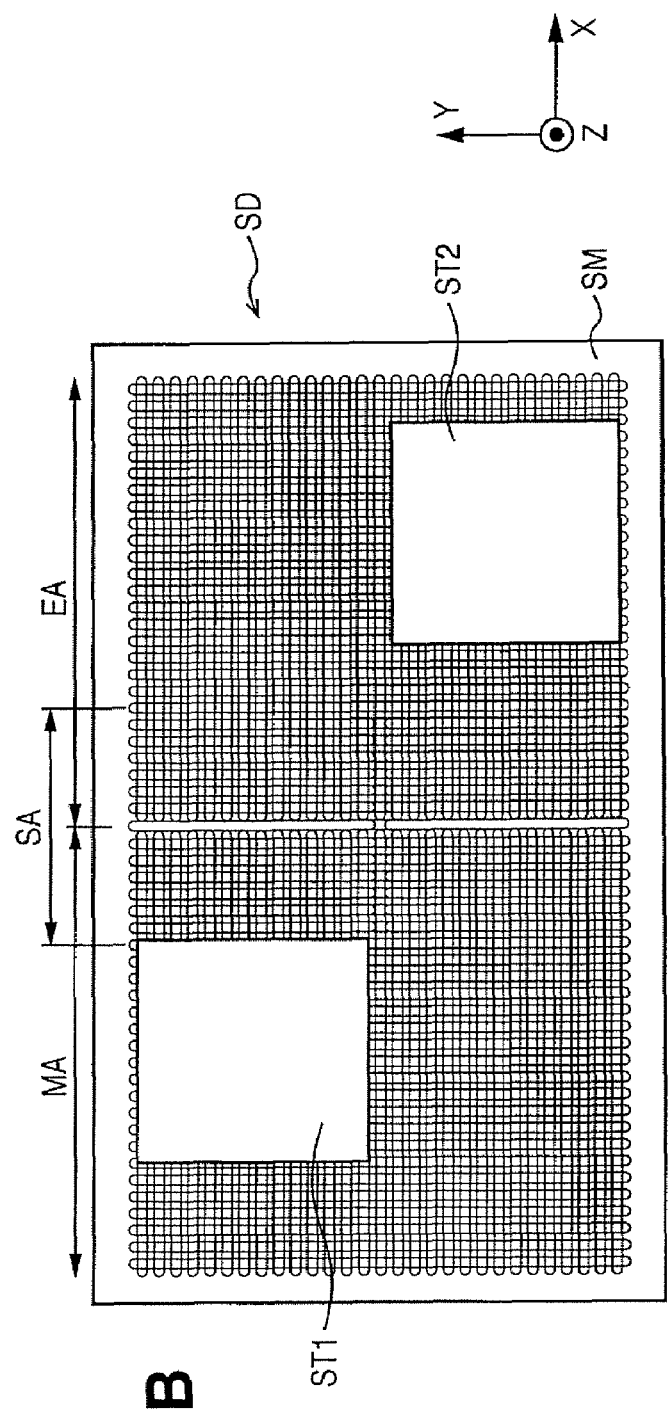
FIG. 1A
FIG. 1B

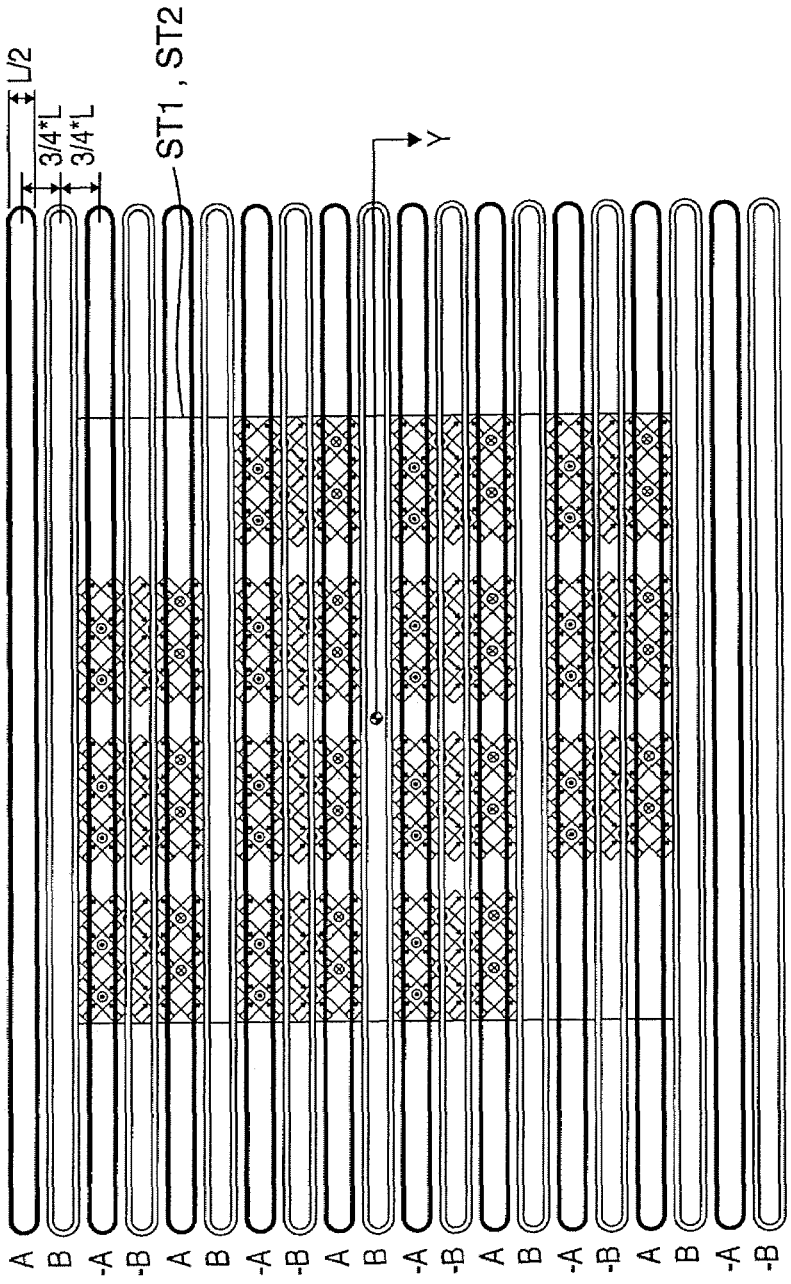

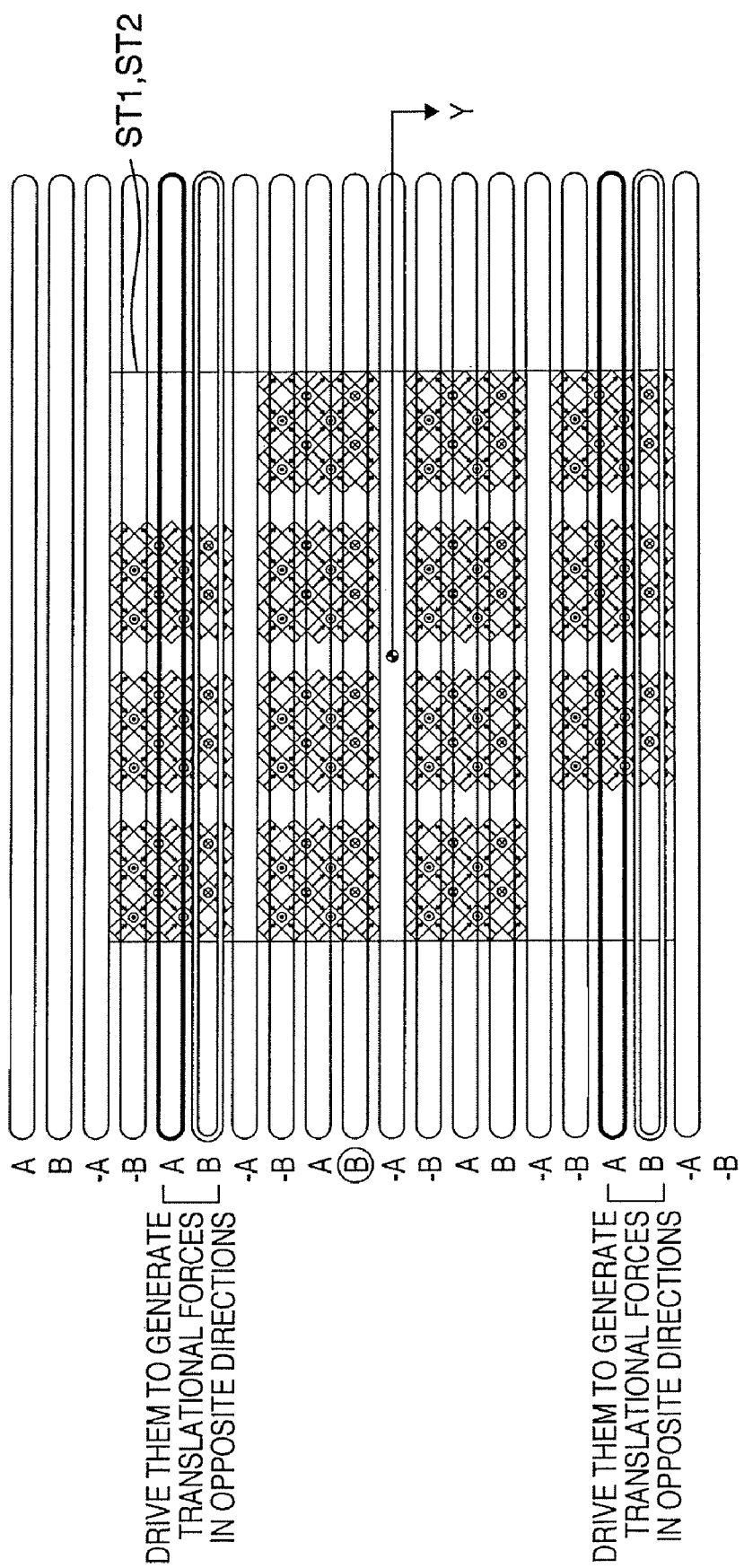

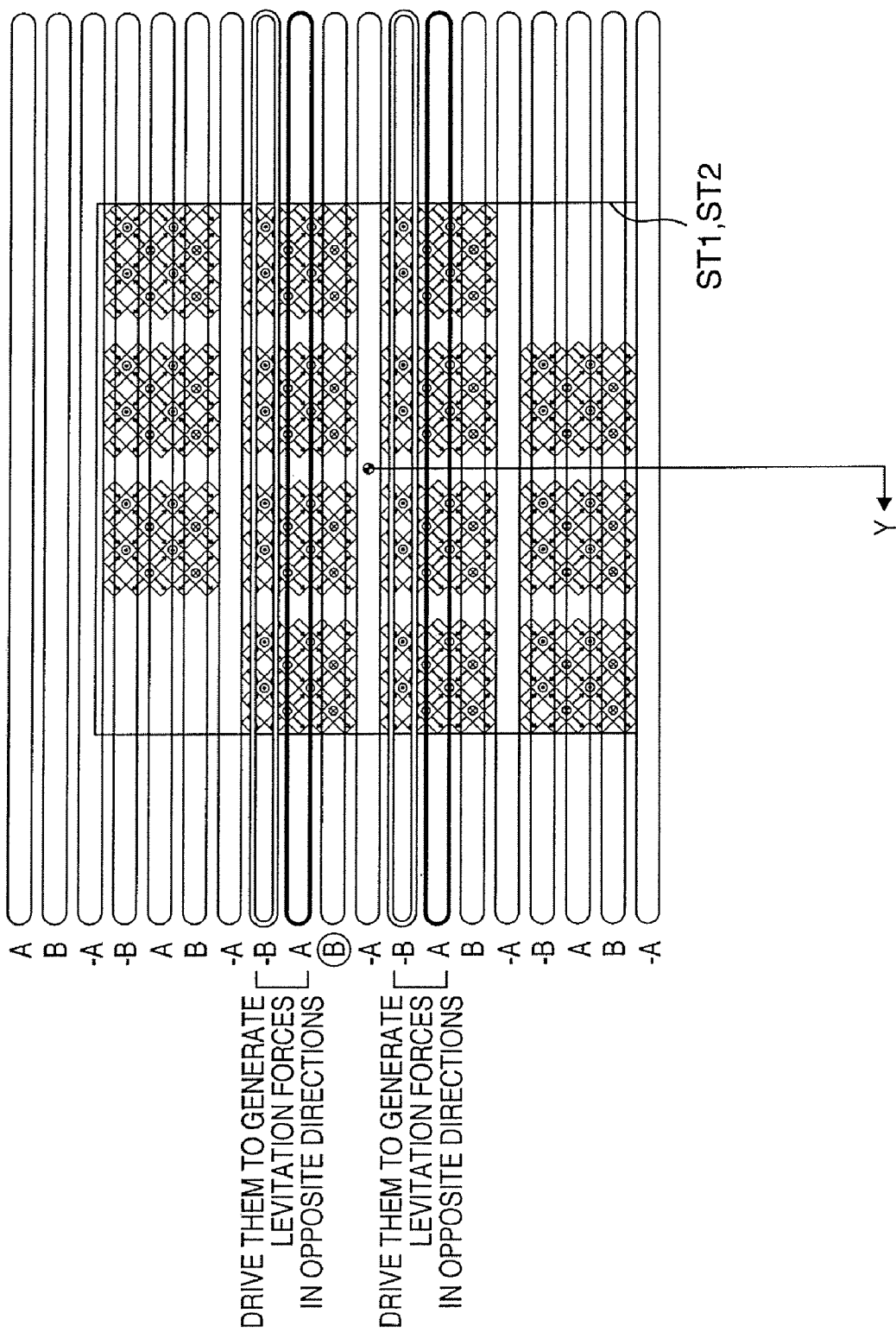

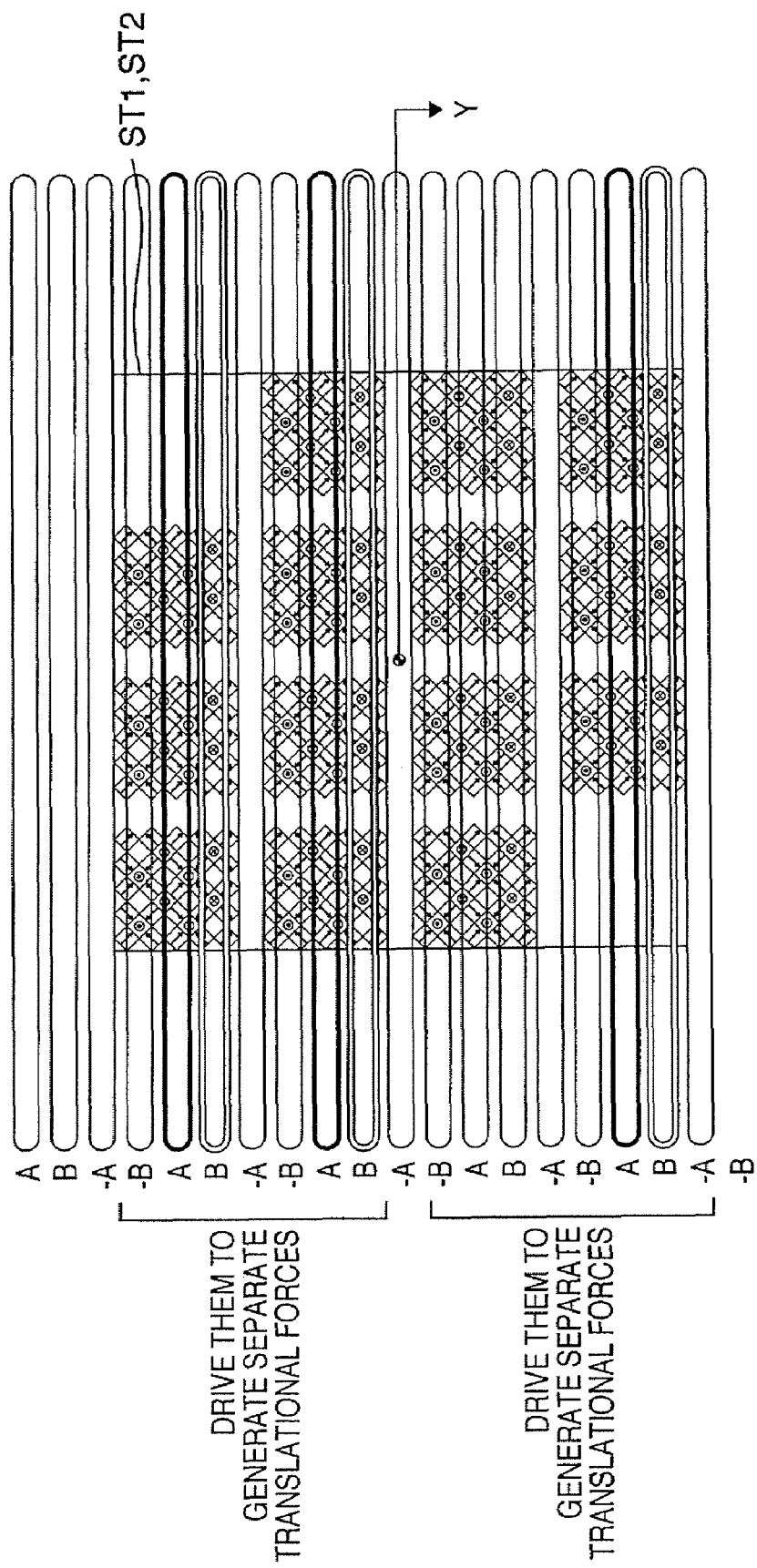

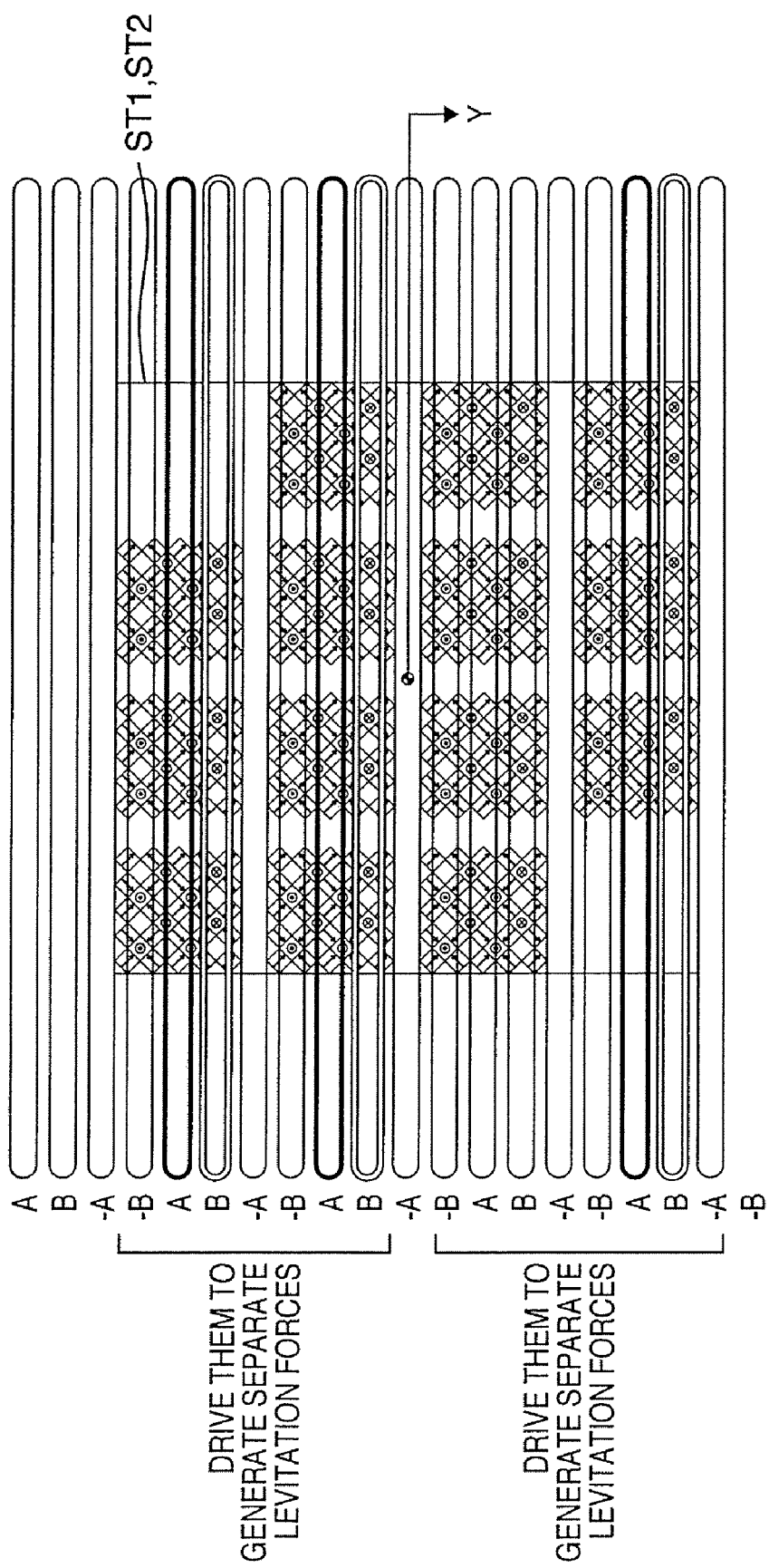

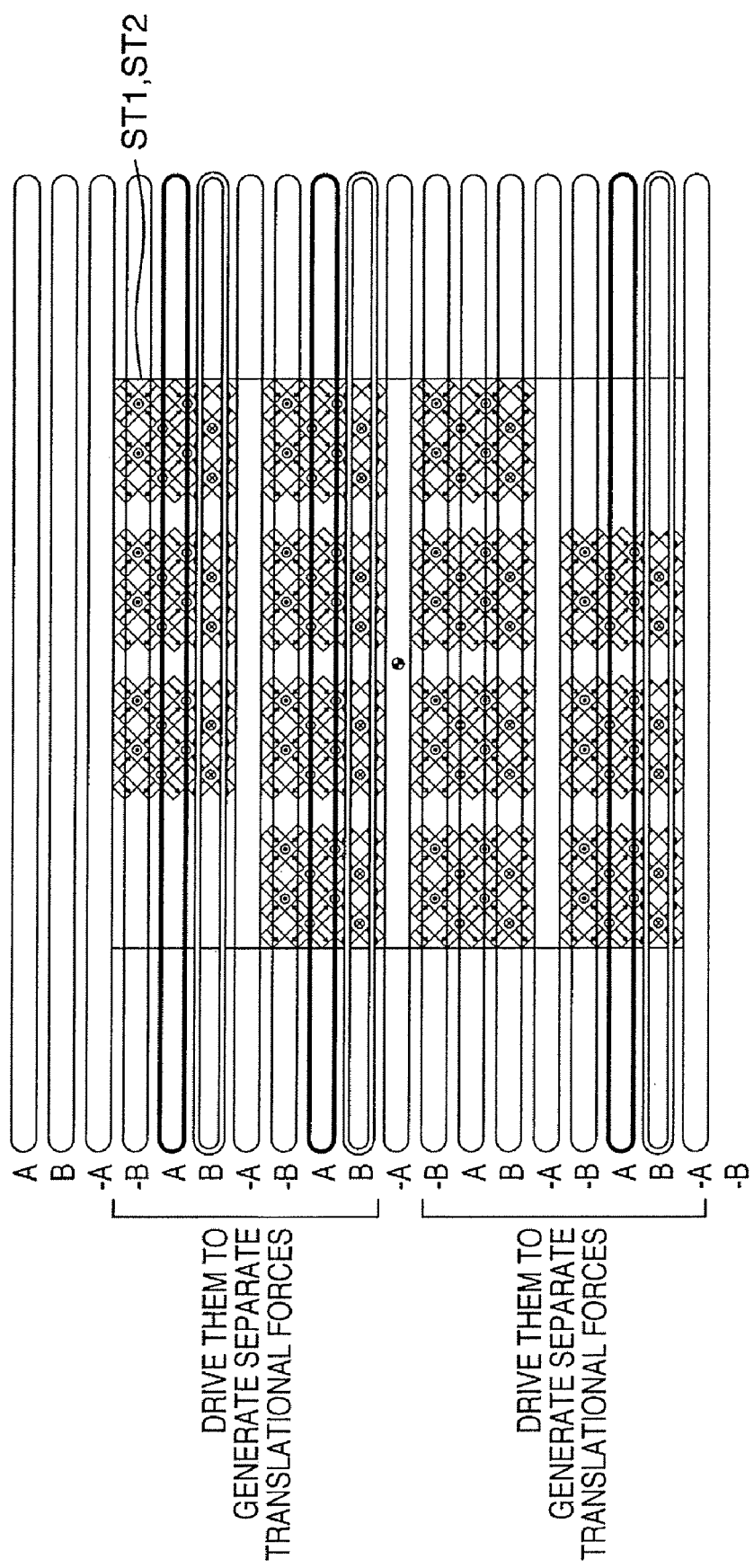

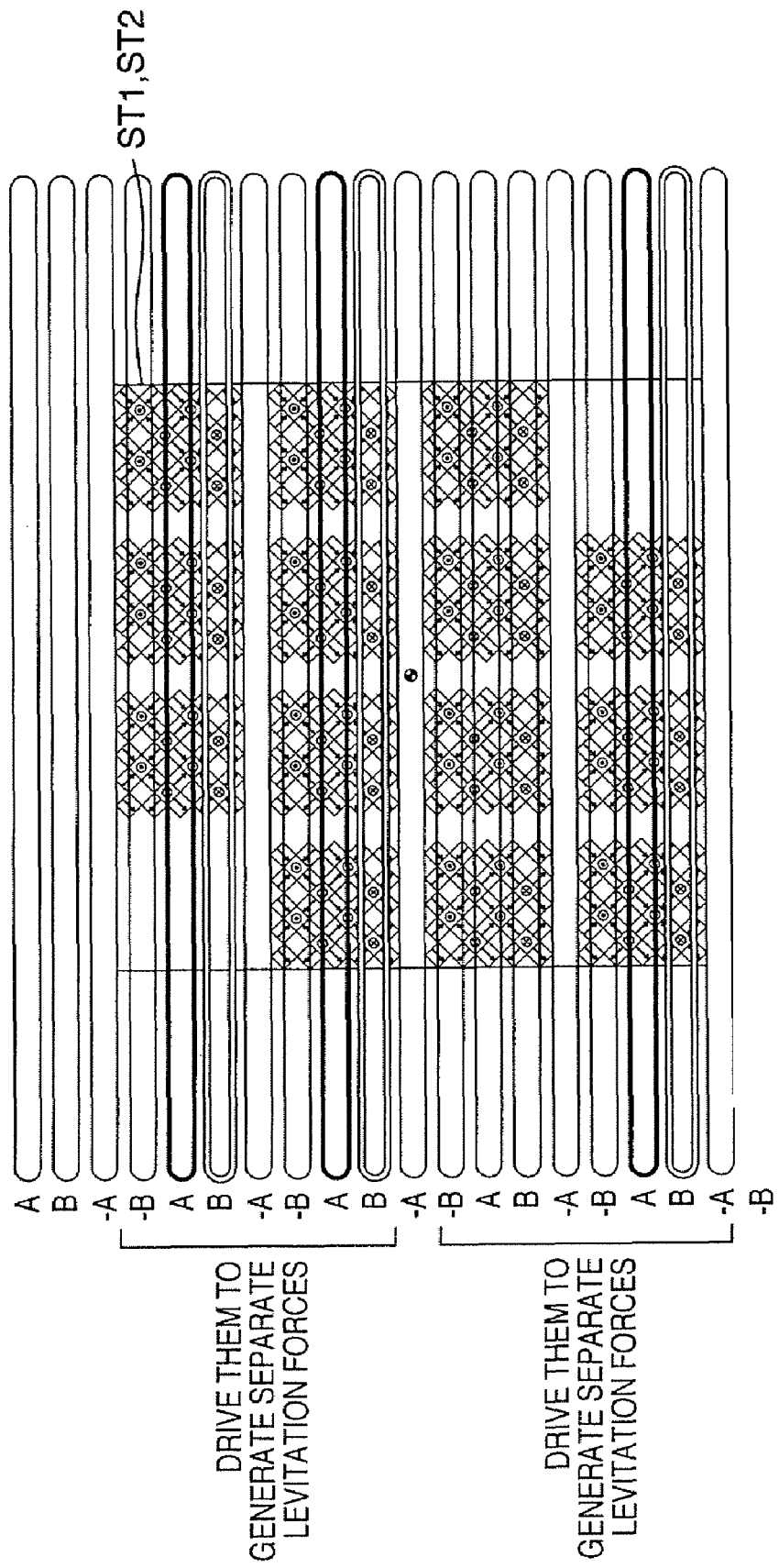

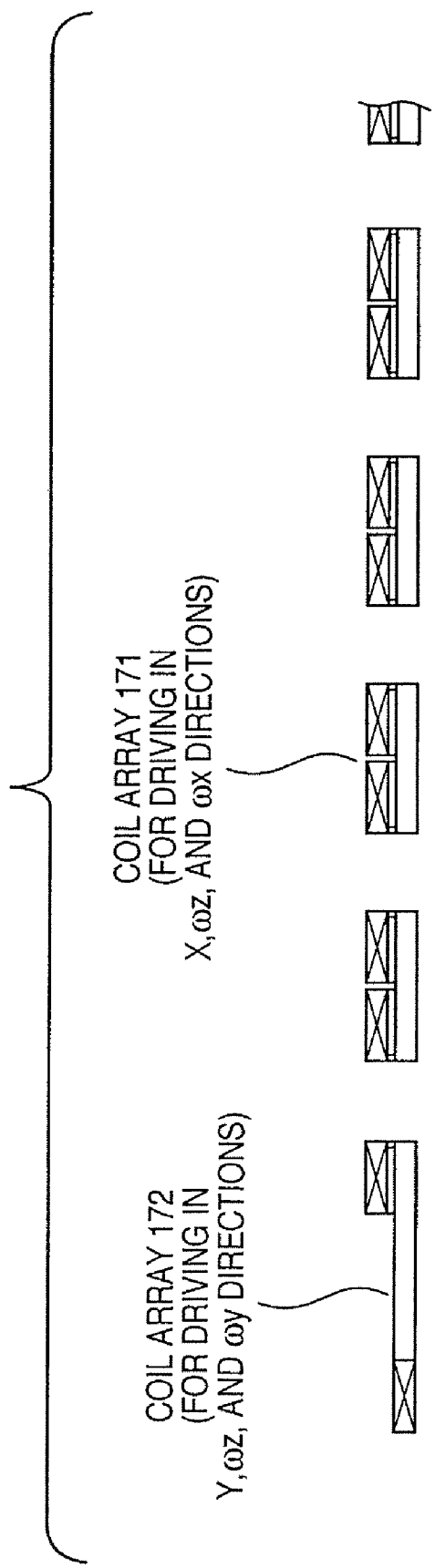

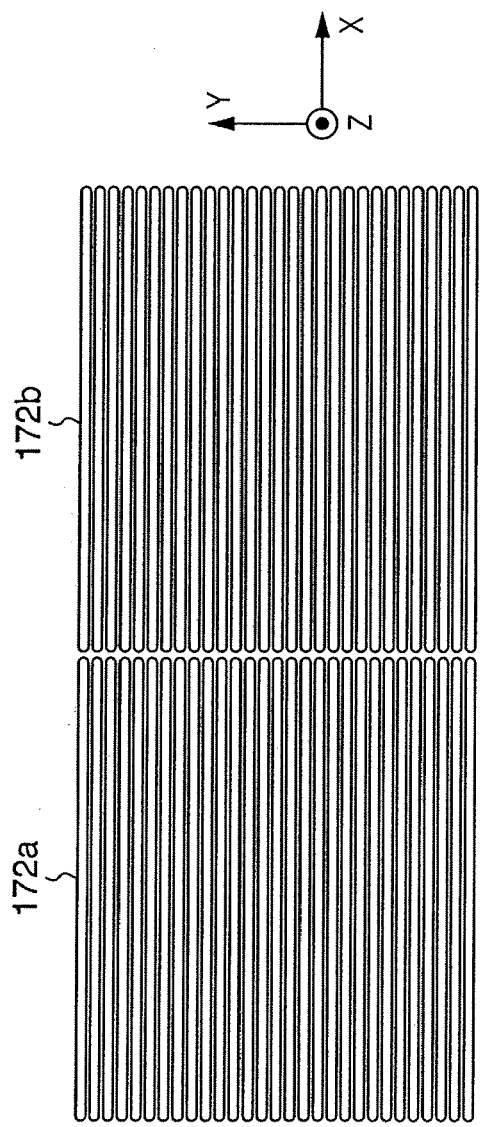
F I G. 18A
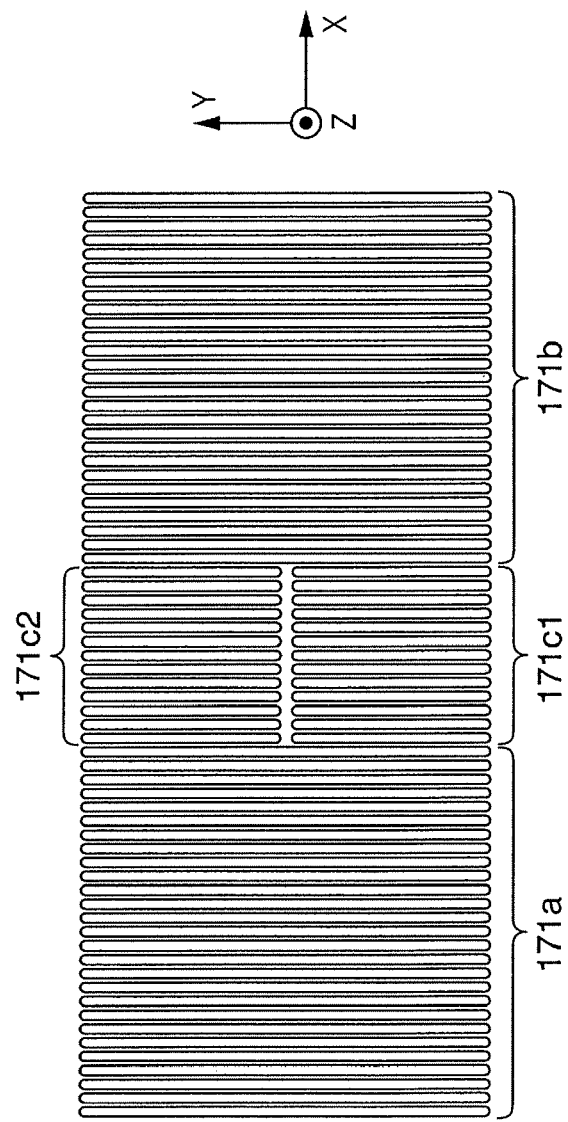
F I G. 18B

DRIVING APPARATUS, EXPOSURE APPARATUS, AND DEVICE MANUFACTURING METHOD

BACKGROUND OF THE INVENTION

1. Field of the Invention

The present invention relates to a driving apparatus which comprises two movable elements, an exposure apparatus, and a device manufacturing method using the exposure apparatus.

2. Description of the Related Art

Japanese Patent Laid-Open No. 2004-254489 describes an exposure apparatus which comprises a stage device having two wafer stages. Such an exposure apparatus can execute alignment measurement for the wafer on one stage while exposing the wafer on the other stage. In an exposure area, the wafer can be exposed by projecting the pattern onto it via a projection optical system. In a measurement area, alignment measurement can be done by measuring the position of the mark on the wafer using a measurement optical system. The two stages can be swapped between the exposure area and the measurement area.

The stage device comprises two movable elements which function as stages, and a stator having a flat portion. Each movable element comprises an almost rectangular parallelepiped top plate, a plurality of permanent magnets provided on the lower side of the top plate (stator side), and a substrate holding unit (substrate chuck) provided on the top plate.

The stator comprises a coil unit. FIGS. 18A and 18B are views showing the arrangement of a coil unit of a stator. The coil unit includes first coil arrays 171, i.e., 171a, 171b, and 171c for driving in the X, ωz, and ωy directions, and second coil arrays 172, i.e., 172a and 172b for driving in the Y, ωz, and ωy directions. The first coil arrays 171 and the second coil arrays 172 are superimposed on each other.

The first coil arrays 171 are formed by juxtaposing, in the X direction, a plurality of coils which have straight portions along the Y direction and produce a thrust in the X direction. The second coil arrays 172 are formed by juxtaposing, in the Y direction, a plurality of coils which have straight portions along the X direction and produce a thrust in the Y direction.

To execute the alignment measurement process and exposure process in parallel, the two stages (movable elements) must be driven independently. As shown in FIG. 18B, the first coil arrays 171 including coils which produce a thrust in the X direction are formed by juxtaposing, in the X direction, a plurality of coils which have straight portions along the Y direction and produce a thrust in the X direction. This makes it possible to independently drive the two stages (movable elements) to execute the measurement process and exposure process in parallel. However, to swap the two stages by respectively driving them in the +Y direction and −Y direction, the two stages must be driven independently even when they align themselves in the Y direction. To meet this demand, the first coil arrays 171 include swap coil arrays 171c1 and 171c2 which are divided in the Y direction. As a result, the first coil arrays 171 include the coil array 171a for the measurement process and swap process, the coil array 171b for the exposure process and swap process, and the coil arrays 171c1 and 171c2 dedicated to the swap process.

As shown in FIG. 18A, the second coil arrays 172 including coils which produce a thrust in the Y direction are divided in the X direction. The divided coil array 172a drives the stage for the measurement process and swap process, while the divided coil array 172b drives the stage for the exposure process and swap process.

In the exposure apparatus disclosed in Japanese Patent Laid-Open No. 2004-254489, the first coil arrays 171 have the coil arrays 171c1 and 171c2 dedicated to the swap process, in addition to the coil arrays 171a and 171b. The coil arrays 171a, 171b, 171c1, and 171c2 are two-dimensionally juxtaposed. This increases the installation area (footprint) of the stage device or exposure apparatus by the areas occupied by the coil arrays 171c1 and 171c2 dedicated to the swap process.

SUMMARY OF THE INVENTION

The present invention has been made in consideration of the above problems, and has as its object to, e.g., decrease the foot print of an apparatus having two movable elements which can be swapped with each other.

A first aspect of the present invention relates to a driving apparatus which comprises a stator and two movable elements. The stator includes a first area and a second area. The movable elements can move on the stator. The movable elements include magnets, while the stator includes a coil unit. The coil unit includes a driving coil which independently drives the two movable elements when said two movable elements are situated within the first area and the second area, respectively, and a swap coil which swaps the two movable elements between the first area and the second area. The coil unit is configured such that the swap coil and at least part of the driving coil are superimposed on each other.

According to a preferred embodiment of the present invention, the swap coil can drive the two movable elements in opposite directions parallel to a first direction in which the first area and the second area align themselves.

According to another preferred embodiment of the present invention, the swap coil can include two coil arrays divided in a second direction perpendicular to the first direction. Each coil array is formed by juxtaposing, in the first direction, a plurality of coils including straight portions along the second direction.

According to still another preferred embodiment of the present invention, the swap coil can be arranged at a position farther from the movable element than the driving coil.

According to still another preferred embodiment of the present invention, the first area can be an area to execute an alignment measurement process for a substrate supported on the movable element. The second area can be an area to execute an exposure process for the substrate while aligning the substrate on the basis of the alignment measurement result.

According to still another preferred embodiment of the present invention, the driving coil can be used for a swap process for swapping the two movable elements, in addition to the measurement process and the exposure process.

A second aspect of the present invention relates to an exposure apparatus which executes an alignment measurement process and an exposure process in parallel. The exposure apparatus comprises a stage device, measurement unit, and exposure unit. The stage device comprises a stator and two movable elements. The stator includes a measurement area and an exposure area. The movable elements can move on the stator and each include a chuck which holds a substrate. The measurement unit executes the measurement process within the measurement area. The exposure unit executes the exposure process for the substrate within the exposure area while aligning the substrate on the basis of the measurement result obtained by the measurement unit. The movable elements include magnets, while the stator includes a coil unit. The coil unit includes a driving coil which independently drives the two movable elements within the measurement area and the exposure area, and a swap coil which swaps the two movable elements between the measurement area and the exposure area. The coil unit is configured such that the swap coil and at least part of the driving coil are superimposed on each other.

According to a preferred embodiment of the present invention, the swap coil can drive the two movable elements in opposite directions parallel to a first direction in which the alignment area and the exposure area align themselves.

According to another preferred embodiment of the present invention, the swap coil can include two coil arrays divided in a second direction perpendicular to the first direction. Each coil array can be formed by juxtaposing, in the first direction, a plurality of coils including straight portions along the second direction.

According to still another preferred embodiment of the present invention, the swap coil can be arranged at a position farther from the movable element than the driving coil.

According to still another preferred embodiment of the present invention, the driving coil can be used for a swap process for swapping the two movable elements, in addition to the measurement process and the exposure process.

A third aspect of the present invention relates to a method of manufacturing a device, comprising steps of exposing a photosensitive agent applied to a substrate using the above-described exposure apparatus, developing the photosensitive agent, and processing (e.g., etching) the substrate.

According to the present invention, it is possible to, e.g., reduce the footprint of an apparatus having two movable elements which can be swapped with each other, by superimposing a swap coil and at least part of a driving coil on each other.

Further features of the present invention will become apparent from the following description of exemplary embodiments with reference to the attached drawings.

BRIEF DESCRIPTION OF THE DRAWINGS

FIGS. 1A and 1B are views schematically showing the arrangement of an exposure apparatus having twin stages according to a preferred embodiment of the present invention;

FIG. 5 is a view for explaining the principle of generation of a translational force and levitation force;

FIG. 8 is a view for explaining a method of driving in the $\omega z$ direction;

FIG. 10 is a view for explaining a method of driving in the $\omega y$ direction;

FIG. 13 is a view for explaining driving in the Y and $\omega z$ directions;

FIG. 14 is a view for explaining driving in the Z and $\omega x$ directions;

FIG. 15 is a view for explaining driving in the X and $\omega z$ directions;

FIG. 16 is a view for explaining driving in the Z and $\omega y$ directions;

FIG. 17 is a view illustrating a two-layered driving coil;

FIGS. 18A and 18B are views showing the arrangement of a coil unit of a stator;

DESCRIPTION OF THE EMBODIMENT

Figure 2:
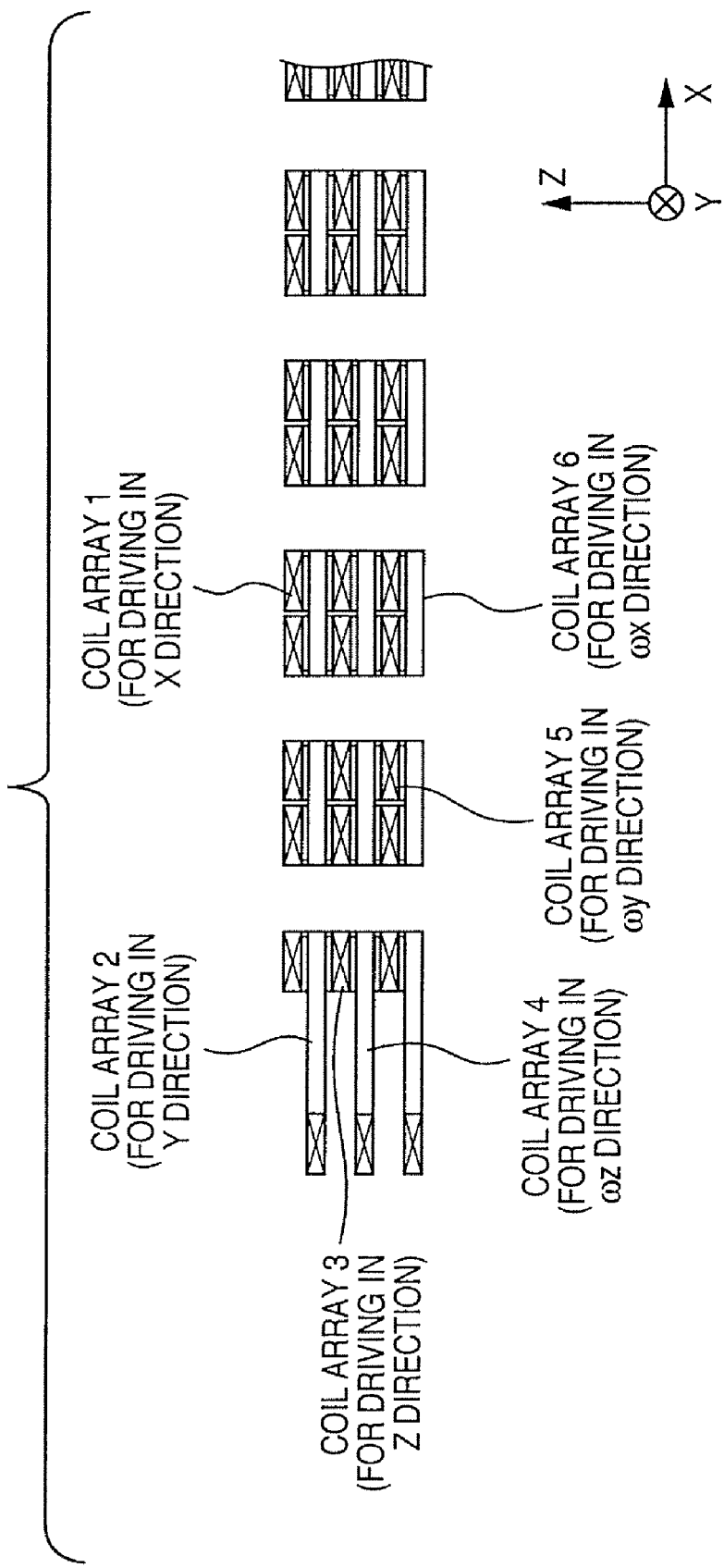
FIG. 2 is a view showing an arrangement example of a driving coil.

A preferred embodiment of the present invention will be described below with reference to the accompanying drawings.

FIGS. 1A and 1B are views schematically showing the arrangement of an exposure apparatus having twin stages according to a preferred embodiment of the present invention. FIG. 1A is a schematic side view showing an exposure apparatus 100 (hatched portions indicate sections). FIG. 1B is a schematic plan view showing a stage device SD of the exposure apparatus 100.

The exposure apparatus 100 comprises the stage device (driving apparatus) SD which has twin stages and serves as a device for driving an exposure target substrate. The stage device SD has two stages (movable elements) ST1 and ST2 on a stator SM having a flat portion to be able to drive the two stages ST1 and ST2 on it. A measurement area MA, exposure area EA, and swap area SA are defined as areas where the stages ST1 and ST2 on the flat portion can move. The swap area SA partially overlaps the measurement area MA and exposure area EA.

In the measurement area MA, a measurement unit MU including a measurement optical system executes an alignment measurement process for the substrate held by a chuck on the stage within the measurement area MA. In the exposure area EA, an exposure unit EU including a projection optical system executes an exposure process for the substrate while aligning it on the stage within the exposure area EA on the basis of the measurement processing result.

While one stage is used to expose the substrate within the exposure area EA, the other stage is used for alignment measurement for the substrate within the measurement area MA. The positions of the two stages ST1 and ST2 can be swapped with each other within the swap area SA. The first stage such as the stage ST1 which holds the substrate measured within the measurement area MA moves into the exposure area EA. In the exposure area EA, the moved substrate is exposed while being aligned on the basis of the measurement result. On the other hand, the second stage such as the stage ST2 which holds the substrate exposed within the exposure area EA moves from the exposure area EA to the measurement area MA when the first stage moves from the measurement area MA to the exposure area EA. The exposed substrate on the second stage is unloaded at an appropriate timing to load a new substrate on the second stage.

The stage device SD comprises a stator SM placed on the floor, and the planar motor movable elements (stages) ST1 and ST2 which move in the X and Y directions on the planar motor stator SM.

Each of the movable elements ST1 and ST2 can comprise, e.g., an almost rectangular parallelepiped top plate, a plurality of permanent magnets provided on the lower side of the top plate (stator side), and a substrate chuck provided on the top plate. The top plate is desirably made of a high-rigidity material such as ceramic.

The planar motor stator SM comprises a base B, and a coil unit arranged on or in the base B. The stator SM includes the measurement area MA and exposure area EA. The movable elements ST1 and ST2 can move between the measurement area MA and the exposure area EA.

The coil unit includes a driving coil DC for independently driving the two movable elements within the measurement area MA and exposure area EA, and a swap coil SC for swapping the two movable elements between the measurement area MA and the exposure area EA. The driving coil DC can drive the movable elements within the areas MA and EA in the X-, Y-, and Z-axis directions, and in the ωx, ωy, and ωz directions as the rotation directions around the X, Y, and Z axes. For example, the swap coil SC can be arranged on the base B through an insulating sheet, and the driving coil DC can be arranged on the swap coil SC through an insulating sheet.

Figure 3A:
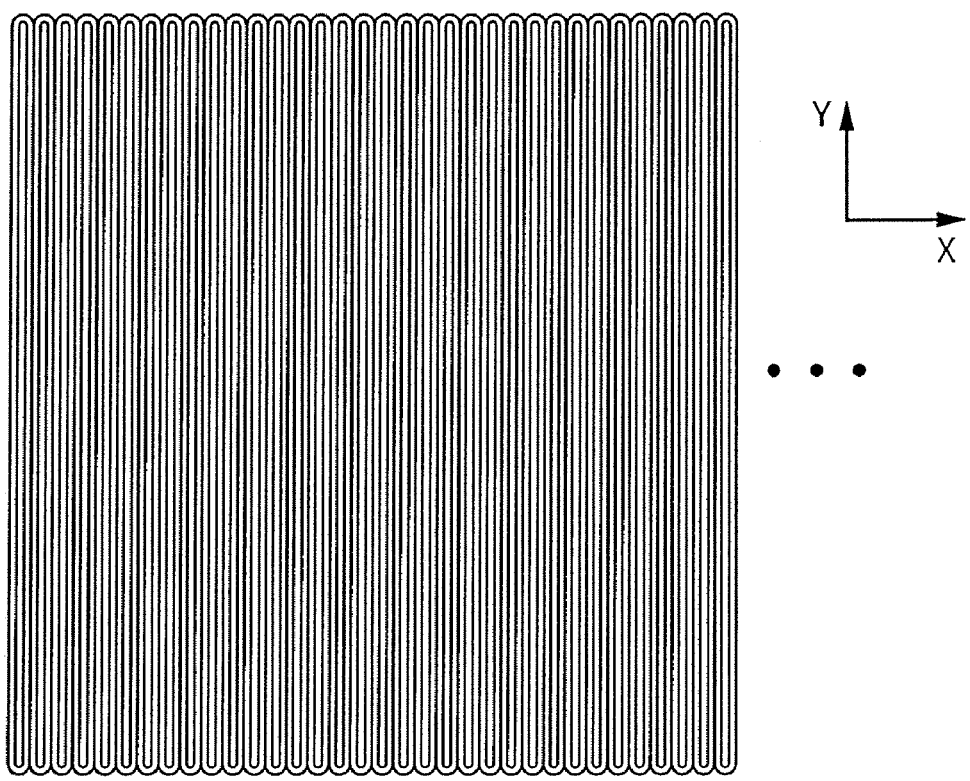
FIGS. 3A and 3B are views showing arrangement examples of coils.
Figure 3B:
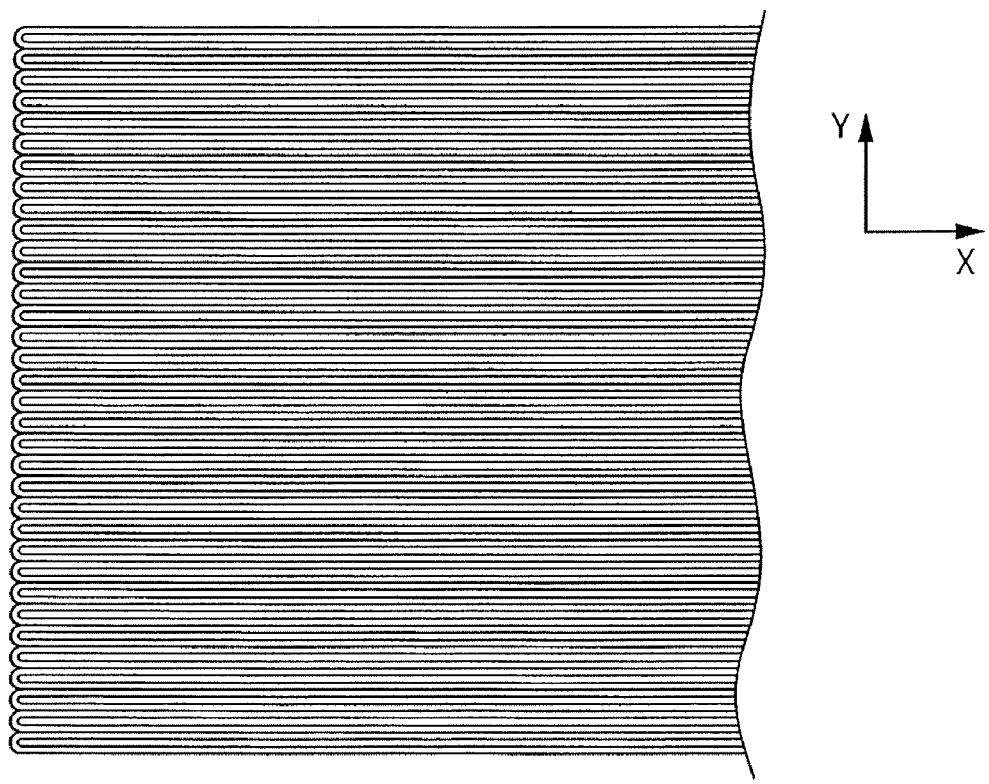

FIG. 2 is a view showing an arrangement example of the driving coil DC. The driving coil DC can include, e.g., coil arrays 1 to 6 which form six layers. A coil array of each layer can be formed by juxtaposing a plurality of almost round shaped rectangular coils, as illustrated in FIG. 3A or 3B. Each coil can include a straight portion arranged parallel to the X direction or Y direction. In the arrangement example shown in FIG. 2, there are three layers in which straight portions of coils are parallel to the X direction, and three layers in which straight portions of coils are parallel to the Y direction.

The coil array 6 can be arranged on the swap coil SC through an insulating sheet. The coil array 6 is a coil layer in which a plurality of almost round shaped rectangular coils having straight portions parallel to the X direction are juxtaposed in the Y direction. The coil array 6 can be used for driving in the ωx direction. The coil array 5 can be arranged on the coil array 6 through an insulating sheet. The coil array 5 is a coil layer in which a plurality of almost round shaped rectangular coils having straight portions parallel to the Y direction are juxtaposed in the X direction. The coil array 5 can be used for driving in the ωy direction. The coil array 4 can be arranged on the coil array 5 through an insulating sheet. The coil array 4 is a coil layer in which a plurality of almost round shaped rectangular coils having straight portions parallel to the X direction are juxtaposed in the Y direction. The coil array 4 can be used for driving in the ωz direction. The coil array 3 can be arranged on the coil array 4 through an insulating sheet. The coil array 3 is a coil layer in which a plurality of almost round shaped rectangular coils having straight portions parallel to the Y direction are juxtaposed in the X direction. The coil array 3 can be used for driving in the Z direction. The coil array 2 can be arranged on the coil array 3 through an insulating sheet. The coil array 2 is a coil layer in which a plurality of almost round shaped rectangular coils having straight portions parallel to the X direction are juxtaposed in the Y direction. The coil array 2 can be used for driving in the Y direction. The coil array 1 can be arranged on the coil array 2.through an insulating sheet. The coil array 1 is a coil layer in which a plurality of almost round shaped rectangular coils having straight portions parallel to the Y direction are juxtaposed in the X direction. The coil array 1 can be used for driving in the X direction.

Figure 4A:
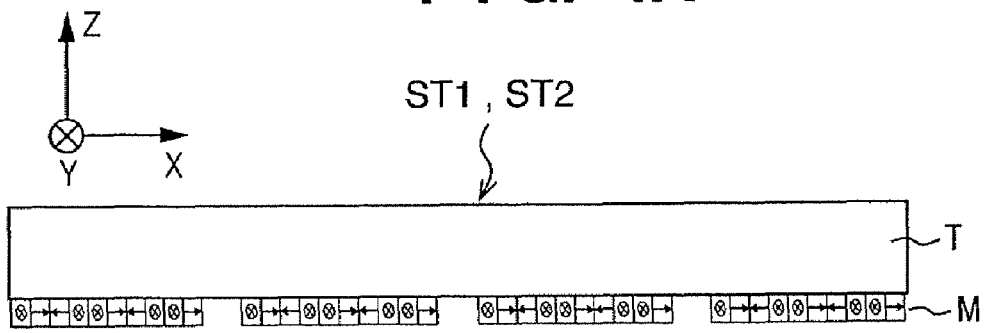
FIGS. 4A and 4B are views showing an arrangement example of a movable element.
Figure 4B:
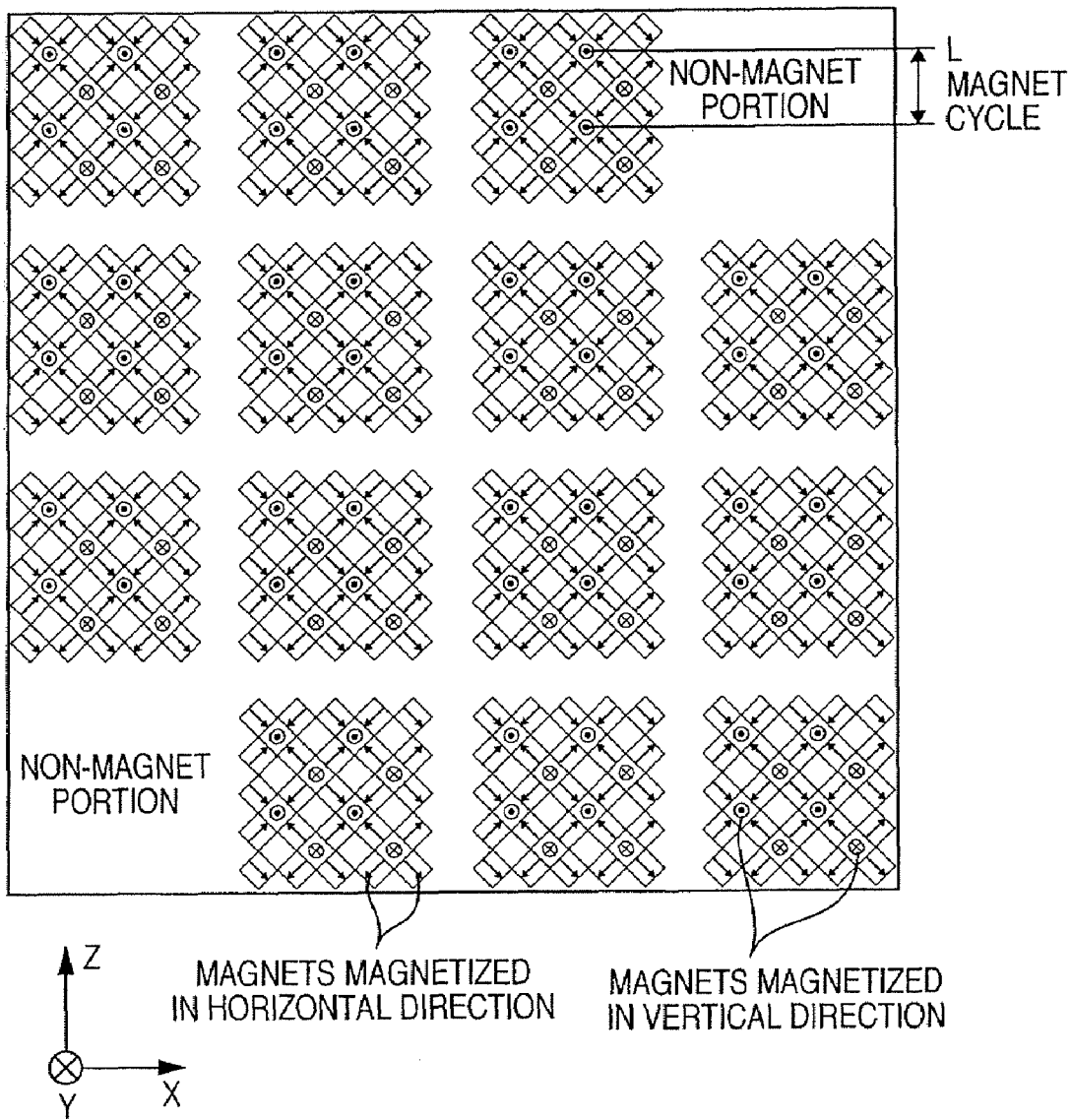

FIGS. 4A and 4B are views showing an arrangement example of the movable elements ST1 and ST2. A magnet array M is fixed to the lower portion of a top plate (stage member) T. The magnet array M includes a magnet magnetized upward in the Z direction, a magnet magnetized downward in the Z direction, and four types of magnets magnetized in the 45° direction, 135° direction, −135° direction, and −45° direction with respect to the X direction.

The magnet magnetized upward in the Z direction is indicated by ○ with x. The magnet magnetized downward in the Z direction is indicated by ○ with ·. Each of the magnets magnetized in the 45° direction, 135° direction, −135° direction, and −45° direction with respect to the X direction is indicated by an arrow of the corresponding magnetization direction.

In the space on the front side of the sheet surface of FIG. 4B, a magnetic flux upward in the Z direction is generated around a magnet magnetized upward in the Z direction, while a magnetic flux downward in the Z direction is generated around a magnet magnetized downward in the Z direction. A magnetic flux in the −135° direction with respect to the X direction is generated around a magnet magnetized in the 45° direction with respect to the X direction. A magnetic flux in the −45° direction with respect to the X direction is generated around a magnet magnetized in the 135° direction with respect to the X direction. A magnetic flux in the 135° direction with respect to the X direction is generated around a magnet magnetized in the −45° direction with respect to the X direction. A magnetic flux in the 45° direction with respect to the X direction is generated around a magnet magnetized in the −135° direction with respect to the X direction. That is, a magnet whose magnetization direction lies in the horizontal plane generates a magnetic flux in a direction opposite to the magnetization direction outside it.

Magnets magnetized in the Z direction align themselves with a cycle L in the X and Y directions, and with a cycle $\sqrt{2} \times L$ in the 45° and −45° directions with respect to the X direction. Magnets magnetized upward in the Z direction and magnets magnetized downward in the Z direction alternately align themselves at every distance $\sqrt{2}/2 \times L$ in the 45° and −45° directions with respect to the X direction. In the 45° direction with respect to the X direction, magnets magnetized in the 45° direction with respect to the X direction and magnets magnetized in the −135° direction with respect to the X axis alternately align themselves between magnets magnetized upward in the Z direction and magnets magnetized downward in the X direction. In the −45° direction with respect to the X direction, magnets magnetized in the −45° direction with respect to the X direction and magnets magnetized in the 135° direction with respect to the X axis alternately align themselves between magnets magnetized upward in the Z direction and magnets magnetized downward in the Z direction. This arrangement method is called a Halbach array.

FIG. 4B is a view when the movable element ST1 or ST2 is viewed from below. On the surface of the magnets on the front side of the sheet surface, magnetic fluxes running to the front side of the sheet surface (i.e., magnetic fluxes running downward in the Z direction) are reinforced upon being gathered from the four directions, while magnetic fluxes running to the deep side of the sheet surface (i.e., magnetic fluxes running upward in the Z direction) are reinforced upon being dispersed in the four directions. In contrast, on the surface of the magnets on the opposite side of the sheet surface, i.e., at the joint portion of the magnets and the top plate, magnetic fluxes cancel each other and are hardly activated. On another side surface of the magnets, when the arrangement of the magnets is viewed along the X and Y directions, both magnets magnetized in the ±Z directions and magnets magnetized in the ±45° directions with respect to the X direction align themselves with the cycle L. Both the vertical magnetic flux density and horizontal magnetic flux density along the X or Y direction are distributed in the form of an almost sine wave with the cycle L. The vertical magnetic flux density and horizontal magnetic flux density are distributed while being shifted from each other by a distance L/4. If the cycle L is 360°, the peak position of the magnetic flux density distribution in the vertical direction is shifted from that in the horizontal direction by 90°.

In the arrangement example shown in FIG. 4B, non-magnet portions are formed at the upper right portion and lower left portion on the diagonal line. As will be described later, the non-magnet portions contribute to generating a moment in the ωz direction. As shown in FIG. 4B, in addition to the non-magnet portions on the diagonal line, there are three straight non-magnet regions in the X direction and those in the Y direction. These non-magnet regions are regions where coils which face each other are always controlled not to be energized. Since these non-magnet regions hardly contribute to generating a thrust, magnets are removed from them for weight reduction. As a result, 14 small magnet units are arranged on the lower surface of the top plate. Each magnet unit includes 33 magnets. More specifically, the small magnet unit includes 4 magnets magnetized in the +Z-axis direction and 4 magnets magnetized in the −Z-axis direction. The small magnet unit includes 9 magnets magnetized in the −45° direction, 6 magnets magnetized in the 45° direction, 4 magnets magnetized in the 135° direction, and 6 magnets magnetized in the −135° direction, with respect to the X-axis direction. The arrangements of magnets and non-magnet portions are not limited to the above-described ones. It suffices that forces can act in the translational direction and rotation direction.

The principle of generation of a translational force and levitation force will be explained with reference to FIG. 5. A translational force and levitation force are a Lorentz force which basically follows the Fleming's law. The straight portion of a coil is parallel to the X- or Y-axis direction. When a current is supplied to a coil in a vertical magnetic flux, a translational force in the X- or Y-axis direction is generated. When a current is supplied to a coil in a horizontal magnetic flux, a force in the direction of a levitation force or a force in a direction opposite to that of a levitation force is generated.

FIG. 5 is a view when the coil array 2 and the stage ST1 or ST2 are viewed from below. As described above, the coil array 2 is formed by juxtaposing, in the Y-axis direction, a plurality of coils having straight portions (longitudinal direction) along the X-axis direction. The span of the straight portion of each coil is half the cycle L (i.e., L/2) of magnets magnetized in the Z-axis direction with respect to the X- and Y-axis directions. Adjacent coils are spaced apart from each other by ¾×L. If the cycle L is 360°, adjacent coils are shifted from each other by a phase of 270°. Every two coils are shifted from each other by a phase of 540° (i.e., 180°).

Taking a certain coil as a reference, the next coil is shifted from it by 270°, the second next coil is shifted from it by 180°, the third next coil is shifted from it by 90°, and the fourth coil has the same phase as that of the reference coil. This pattern repeats thereafter. When every two coils are wound in opposite directions or control is done to supply currents in opposite directions to every two coils, the coil array also apparently seems to include coils having two phases of 0° and 90°.

In the arrangement example shown in FIG. 5, currents in opposite directions are always supplied to every two coils, and a coil to which a reverse current is supplied is indicated by a negative sign. Apparently, coils exhibit two phases, i.e., an A phase and B phase, and a −A phase current and −B phase current are automatically determined as currents of the A phase and B phase are determined.

As described above, both the vertical magnetic flux density and horizontal magnetic flux density have an almost sine wave distribution with the cycle L. When a sine wave is so controlled as to supply a current in phase with the vertical magnetic flux density distribution to each coil, a translational force proportional to the sine wave amplitude of the current is generated irrespective of the position.

More specifically, assuming that the position shown in FIG. 5 is Y=0, when the position Y changes in the direction indicated by the arrow, an A phase current and B phase current are given by:

$A$ phase current: $IA = Ic \times \cos((Y/L) \times 2 \times \pi)$ $B$ phase current: $IB = Ic \times \sin((Y/L) \times 2 \times \pi)$ When a current in a direction opposite to that supplied to an A phase coil or B phase coil is supplied to a −A phase coil or −B phase coil, translational forces in the ±Y-axis directions of magnitudes proportional to Ic are generated irrespective of the position.

When control is done to supply a current in phase with the magnetic flux density distribution in the horizontal direction to each coil, an almost constant levitation force or a force opposite to the levitation force is generated irrespective of the position.

More specifically, assuming that the position shown in FIG. 5 is Y=0, when the position Y changes in the direction indicated by the arrow, an A phase current and B phase current are given by:

$A$ phase current: $IA = Ic \times \cos((Y/L) \times 2 \times \pi)$ $B$ phase current: $IB = Ic \times \sin((Y/L) \times 2 \times \pi)$ When a current in a direction opposite to that supplied to an A phase coil or B phase coil is supplied to a −A phase coil or −B phase coil, translational forces in the ±Z-axis directions (levitation forces or forces opposite to the levitation forces) of magnitudes proportional to Ic are generated irrespective of the position. In either case, Ic is arbitrary.

That is, as shown in FIG. 5, a coil layer including coils having straight portions parallel to the X-axis direction can generate a force having an arbitrary strength in the ±Y-axis directions or ±Z-axis directions.

Similarly, a coil layer including coils having straight portions parallel to the Y-axis direction can generate a force having an arbitrary strength in the ±X-axis directions or ±Z-axis directions.

In practice, however, magnets are not arranged on the entire lower surface of the stage member and straight non-magnet regions are formed on it, as described above. No currents are supplied to coils which face non-magnet portions because it is meaningless. In other words, control is done to supply currents to only coils which face magnets.

A method of supplying currents to only coils which face magnets basically amounts to turning on equal numbers of A phase coils and B phase coils or −A phase coils and −B phase coils. In the above description, controlling to supply a current in phase with the magnetic flux density distribution to each coil makes it possible to obtain an almost constant translational force or levitation force irrespective of the position. However, this applies to a case in which equal numbers of A phase coils and B phase coils are turned on. To get equal numbers of A phase coils and B phase coils which act on the magnets, the coils are ON/OFF-controlled as shown in FIGS. 6A, 6B, 7A, and 7B.

Figure 6A:
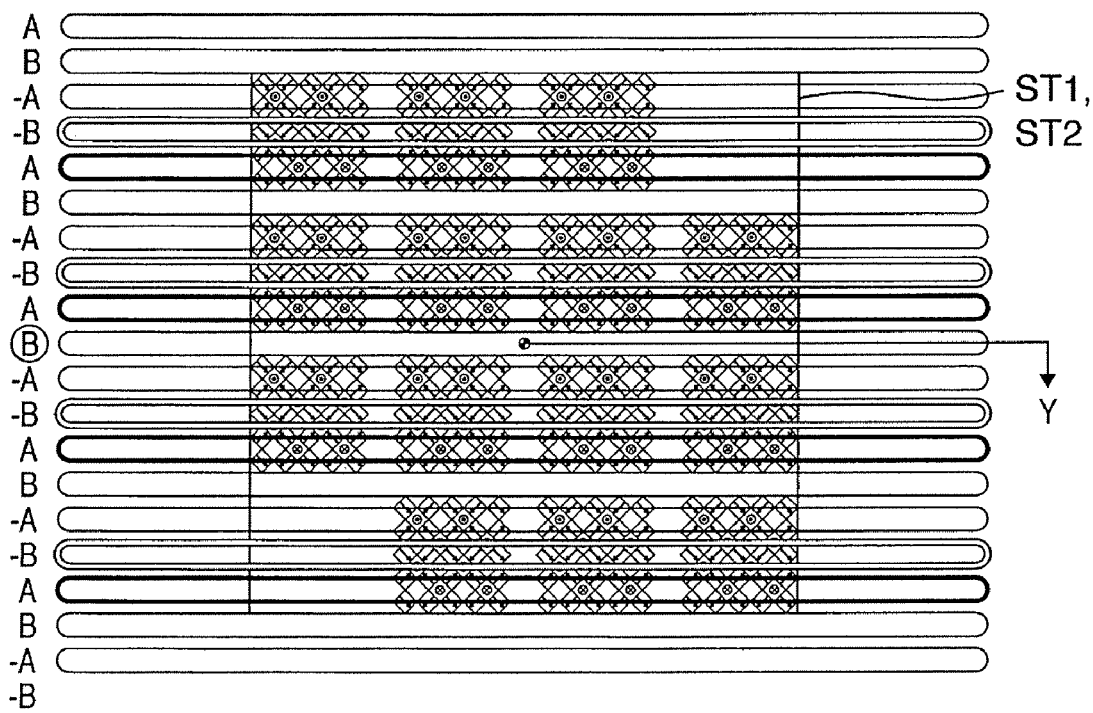
FIGS. 6A and 6B are views for explaining coil switching of a translational system.
Figure 6B:
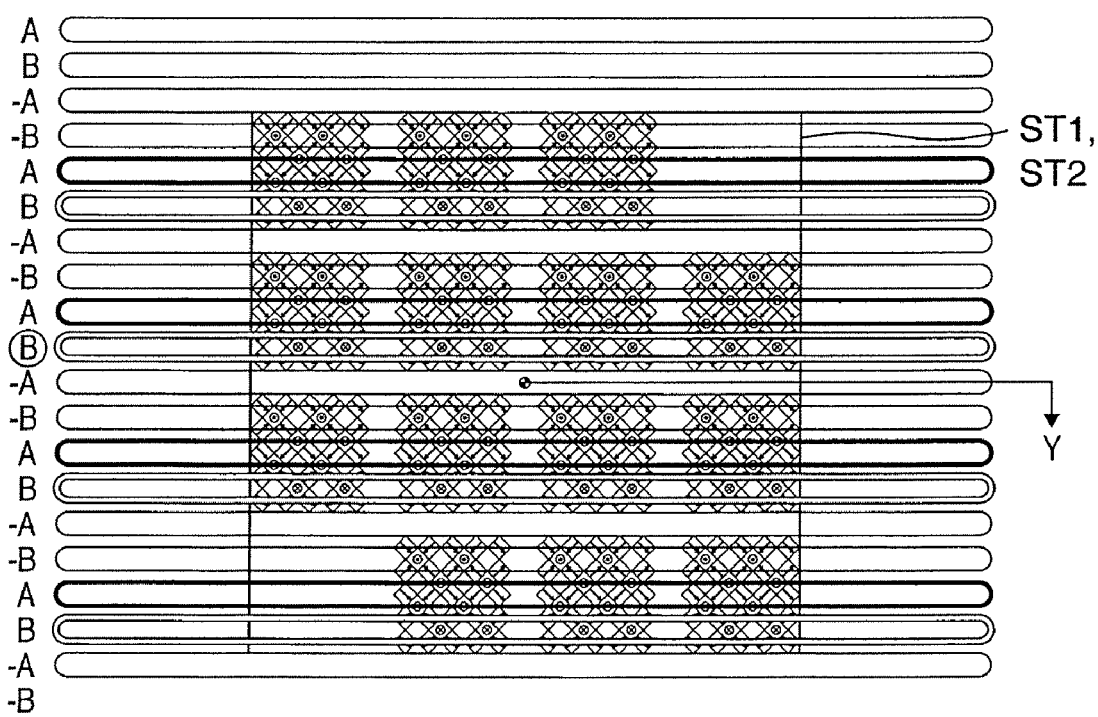

FIGS. 6A and 6B are views for explaining coil switching of a translational system. As shown in FIG. 4B, the 14 small magnet units are arranged on the lower surface of the top plate T. The coils are ON/OFF-controlled so that equal numbers of A phase coils and B phase coils or −A phase coils and −B phase coils act on each small magnet unit. In one layer, the equal number corresponds to 1, and the coils are ON/OFF-controlled so that one A phase coil and B phase coil or one −A phase coil and −B phase coil act on each small magnet unit.

Referring to FIGS. 6A and 6B, ON coils are indicated by double lines or bold solid lines, while OFF coils are indicated by thin lines. FIG. 6A shows the moment when −A phase coils are turned off and A phase coils are turned on while the movable element is en route to the Y-axis direction. FIGS. 6A and 6B show a state in which control is done to generate a translational force. At the position shown in FIG. 6A, control is done so that a B phase current or −B phase current supplied to a coil having a straight portion which exists immediately above magnets magnetized in the ±Z directions becomes maximum, and an A phase current or −A phase current supplied to a coil having a straight portion which exists at the middle of magnets magnetized in the ±Z directions becomes zero. ON/OFF switching from the −A phase coils to the A phase coils is done at this position. Until immediately before a shift to the state shown in FIG. 6A, the −A phase coils are ON and the A phase coils are OFF. At the moment of a shift to the state shown in FIG. 6A, the −A phase coils are turned off and the A phase coils are turned on. The B phase coils are OFF. All coils outside the movable element are OFF irrespective of whether they are A−, B−, −A, or −B phase coils. Currents of a sine or cosine wave are supplied to the A phase coils and −B coils in accordance with the position of the movable element as described above.

In this state, when the movable element further moves in the Y-axis direction, a shift to the state shown in FIG. 6B is made. At the position shown in FIG. 6B, currents supplied to the B phase coils and −B phase coils become zero. The −B phase coils kept ON until now are turned off, and the B phase coils are turned on. The same procedure repeats thereafter. With this control, one A phase (−A phase) coil and one B phase (−B phase) coil act on each small magnet unit. One A phase (−A phase) coil and one B phase (−B phase) coil act on the overall small magnet units. It is therefore possible to generate translational forces in the ±Y-axis directions proportional to the command value irrespective of the position.

Figure 7A:
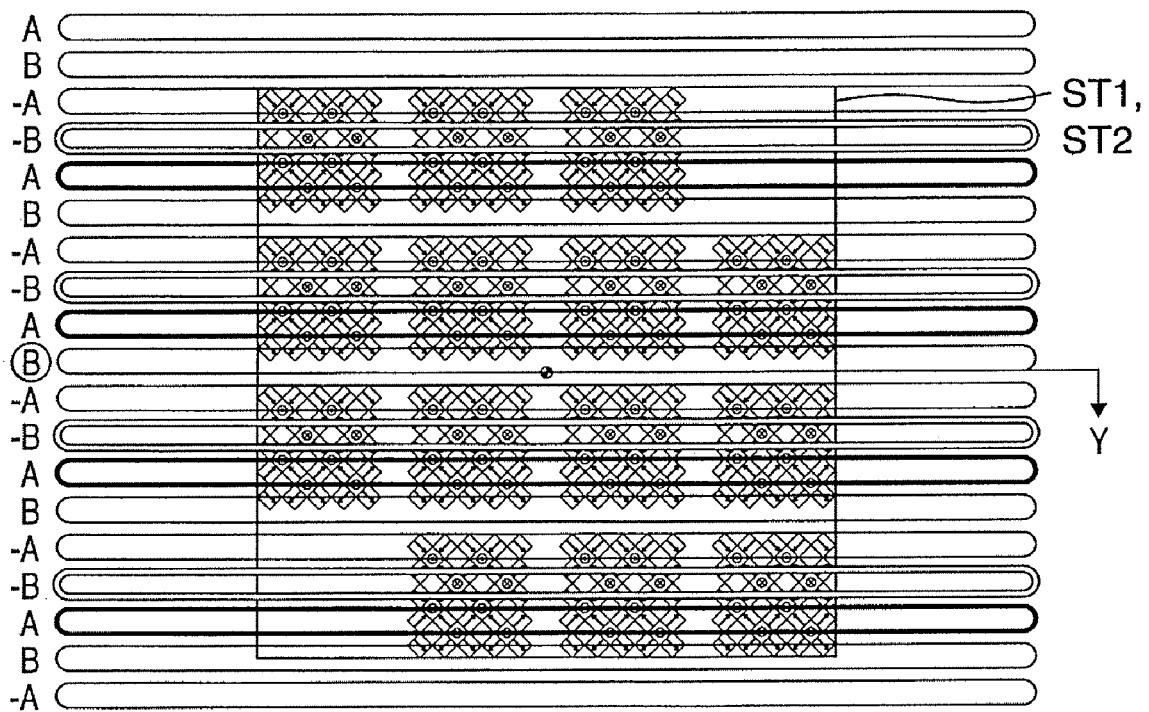
FIGS. 7A and 7B are views for explaining coil switching of a levitation system.
Figure 7B:
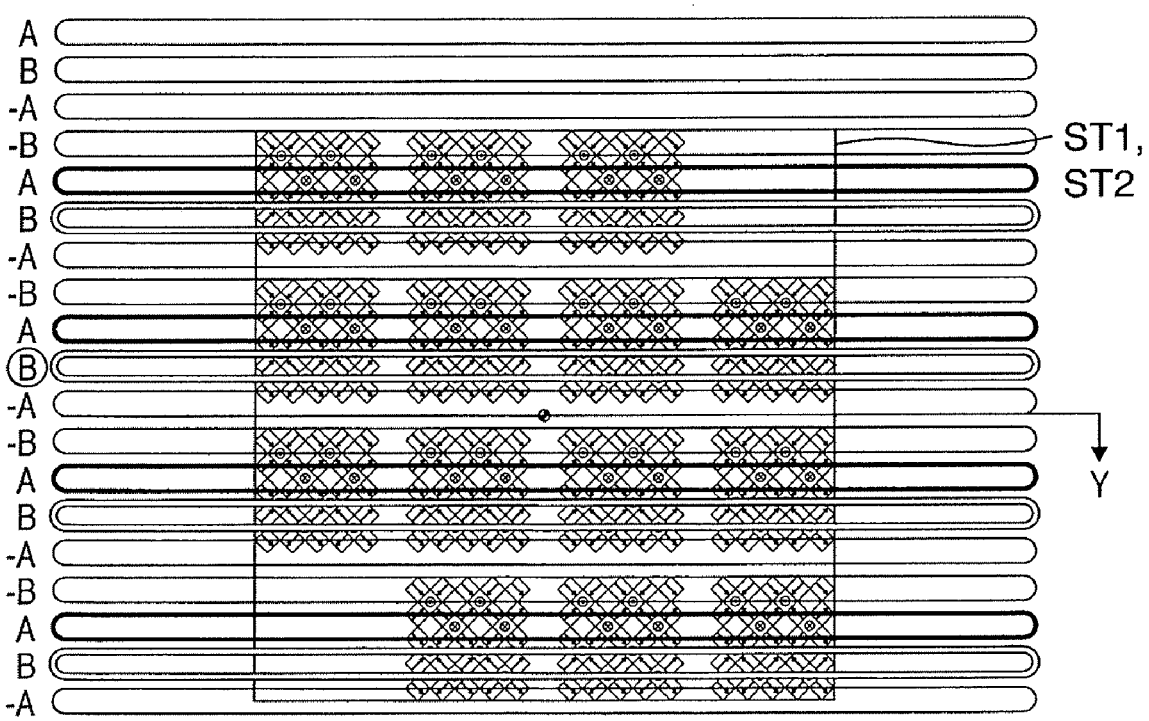

FIGS. 7A and 7B are views for explaining coil switching of a levitation system. Like the switching scheme shown in FIGS. 6A and 6B, switching is done so that one A phase (−A phase) coil and one B phase (−B phase) coil act on each small magnet unit. This switching is executed at the position where the current becomes zero.

The translational system and levitation system are different in position of a coil where the current becomes zero. A translational force is generated by controlling a current supplied to a coil to zero when its straight portion is located at the middle of a magnet magnetized in the +Z-axis direction and a magnet magnetized in the −Z-axis direction. On the other hand, a levitation force is generated by controlling a current supplied to a coil to zero when its straight portion is located immediately above magnets magnetized in the ±Z directions. Assuming that the movable element moves in the Y-axis direction like FIG. 6, switching is done so that the −A phase coils are turned off and the A phase coils are turned on, as shown in FIG. 7A. When the movable element further moves in the Y-axis direction so that the straight portions of a −B phase coil and B phase coil reach immediately above magnets magnetized in the ±Z directions, switching from the −B phase coils to the B phase coils is done. Repeating the same procedure thereafter makes it possible to generate a force in the z direction proportional to the command value irrespective of the position.

The same applies to even a layer in which the straight portions of coils are parallel to the Y-axis direction. It is therefore possible to generate translational forces in the ±Y directions and levitation forces in the ±Z directions proportional to the command value irrespective of the position.

As described above, the stator SM includes three layers which generate translational forces in the ±X-axis directions and forces in the ±Z-axis directions, and three layers which generate translational forces in the ±Y directions and forces in the ±Z directions. It is therefore possible to generate forces in the X-, Y-, and Z-axis directions, i.e., the directions of three degrees of freedom using a combination of the above layers. More specifically, as shown in FIG. 2, the coil array 1 which is located nearest to the magnets and includes a plurality of coils having straight portions parallel to the Y-axis direction drives the movable element in the X direction. The coil array 2 which is adjacent to the coil array 1 and includes a plurality of coils having straight portions parallel to the X-axis direction drives the movable element in the Y-axis direction. The coil array 3 which is adjacent to the coil array 2 and includes a plurality of coils having straight portions parallel to the Y-axis direction drives the movable element in the X-axis direction.

How to generate moments in the ωz, ωx, and ωy directions will be explained with reference to FIGS. 8 to 10.

FIG. 8 is a view for explaining a method of driving in the ωz direction. In a layer including a plurality of coils having straight portions parallel to the X-axis direction, only coil systems which face regions including two non-magnet portions are driven. The coil systems are further driven so as to generate translational forces in opposite directions. The lines of action of the translational forces in opposite directions are shifted from each other in the X direction due to the presence of the non-magnet portions to generate a moment in the ωz direction. More specifically, the coil array 4 shown in FIG. 2 drives the movable element in the ωz direction. A coil current control method and switching method follow the above-described example.

Figure 9:
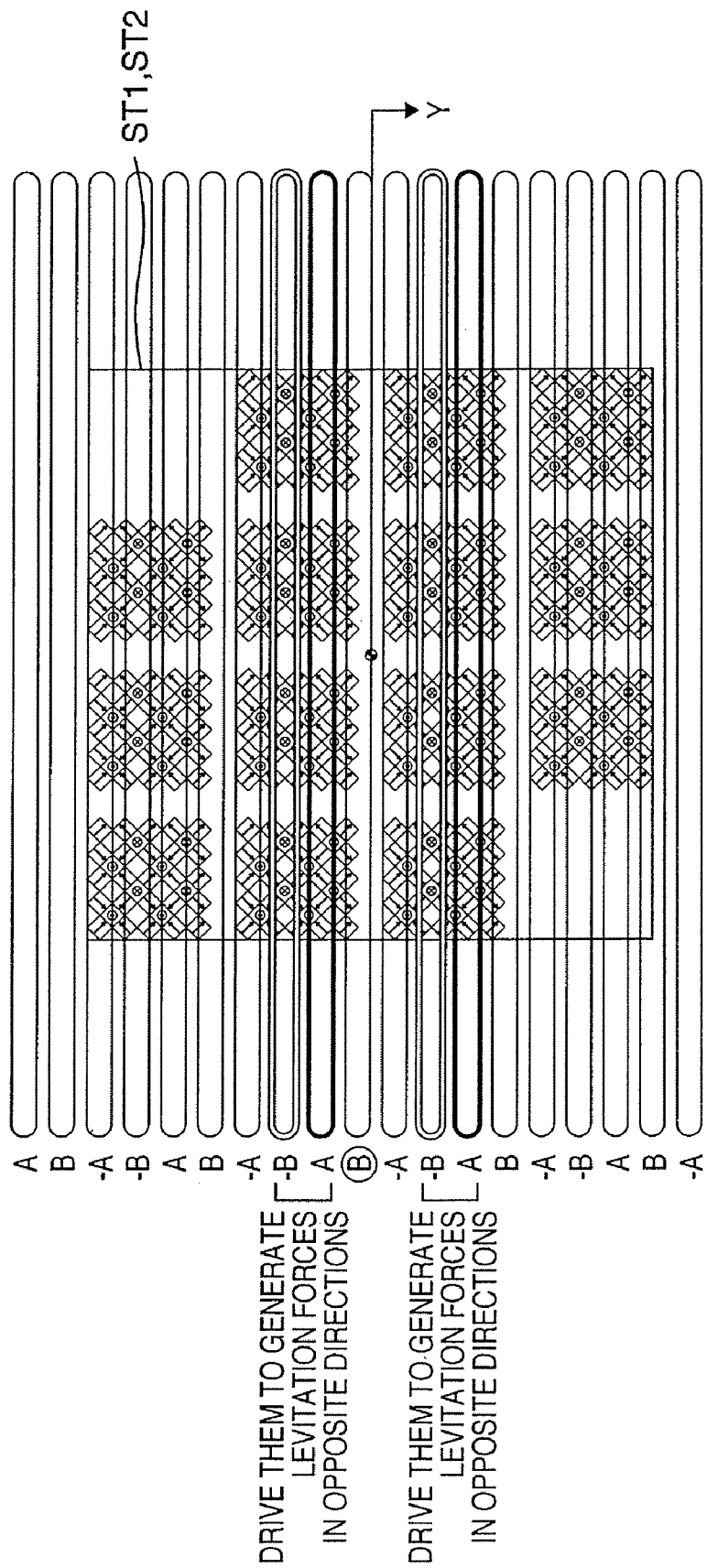
FIG. 9 is a view for explaining a method of driving in the $\omega x$ direction.

FIG. 9 is a view for explaining a method of driving in the ωx direction. In a layer including a plurality of coils having straight portions parallel to the X-axis direction, only coil systems which face 8 small magnet units free from any non-magnet portion are so driven as to generate forces in the ±Z-axis directions. This generates forces in the ±Z-axis directions which are opposite through the central line of the movable element as a boundary. As the forces in opposite directions act along the Z-axis direction at a position shifted in the Y direction, a moment in the ωx direction is generated. More specifically, the coil array 6 shown in FIG. 2 drives the movable element in the ωx direction.

FIG. 10 is a view for explaining a method of driving in the ωy direction. In a layer including a plurality of coils having straight portions parallel to the Y-axis direction, only coil systems which face 8 small magnet units free from any non-magnet portion are so driven as to generate forces in the ±Z-axis directions. This generates forces in the ±Z-axis directions which are opposite through the central line of the movable element as a boundary. As the forces in opposite directions act along the Z-axis direction at a position shifted in the X direction, a moment in the ωy direction is generated. More specifically, the coil array 5 shown in FIG. 2 drives the movable element in the ωy direction.

These forces in the 6-axis directions are proportional to the current. This makes it possible to insulate vibration between the movable element and the stator.

In the arrangement shown in FIGS. 1A and 1B, only the driving coil DC is used to drive the stage within the measurement area MA and exposure area EA in the measurement process and exposure process.

Figure 11A:
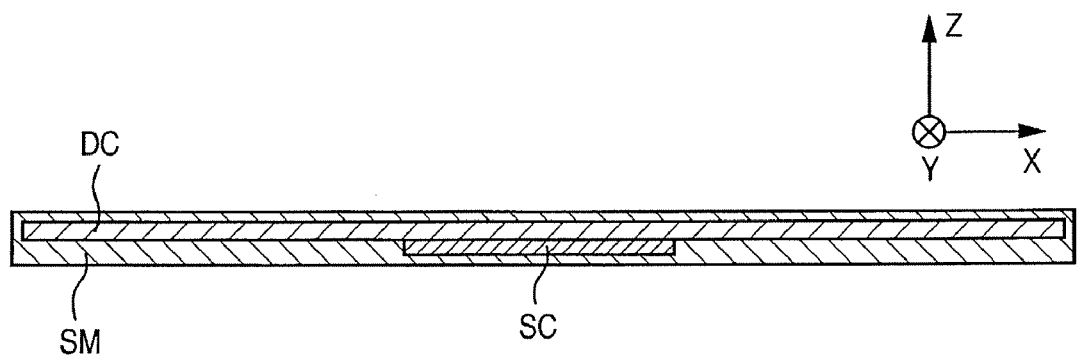
FIGS. 11A and 11B are views showing an arrangement example of a swap coil.
Figure 11B:
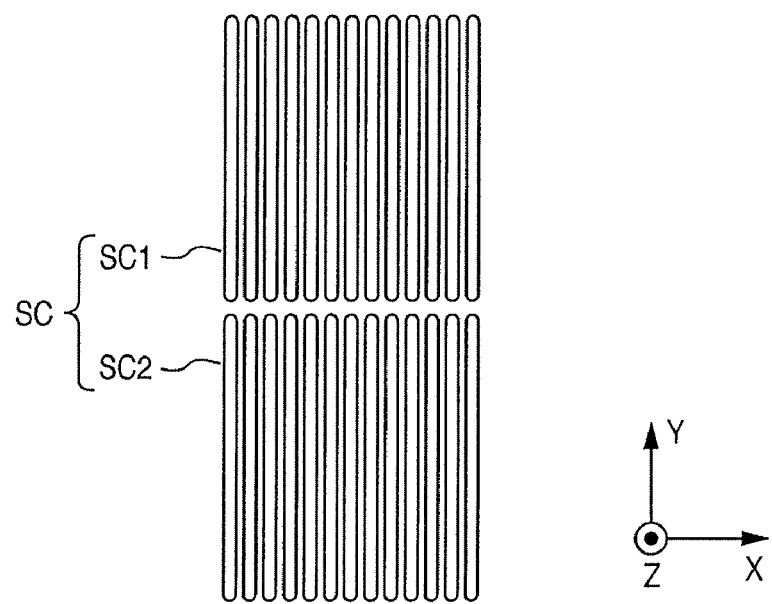

FIGS. 11A and 11B are views showing the swap coil SC. An operation for swapping the stages between the areas MA and EA after completing the measurement process in the measurement area MA and the exposure process in the exposure area EA will be called a swap operation. In the swap operation, while the two stages ST1 and ST2 move in directions which are opposite to each other and parallel to a first direction in which the measurement area MA and exposure area EA align themselves, the stages ST1 and ST2 align themselves in a second direction perpendicular to the first direction at a certain period. During this period, the swap coil SC drives the stages ST1 and ST2 in the first direction. The swap coil SC includes two, i.e., first and second divided swap coil arrays SC1 and SC2 divided in the Y direction (second direction). The first and second divided swap coil arrays SC1 and SC2 are formed by juxtaposing almost round shaped rectangular coils having straight portions parallel to the Y direction (second direction). The first and second divided swap coil arrays SC1 and SC2 are controlled independently. Since the swap coil SC and at least part of the driving coil DC are superimposed on each other, the footprint never increases.

The swap coil SC is preferably arranged at a position farther from the magnet M (or the surface of the stator SM) than the driving coil DC. In this case, at the position of the swap coil SC, the magnetic flux density resulting from the magnet M is smaller than at the position of the driving coil DC. This reduces a thrust per unit current or increases the amount of heat acting upon generating the same thrust. The coil unit is preferably controlled so that the stages ST1 and ST2 complete acceleration in the Y direction until they pass on the swap coil SC, and then they pass on the swap coil SC at a constant speed. Also, the coil unit is preferably controlled so that coils in the driving coil DC, having straight portions parallel to the Y direction yield the weights of the stages ST1 and ST2. It suffices to generate a control force by the swap coil SC. This makes it possible to avoid the heat generation problem posed when the swap coil SC generates a small force.

As described above, superimposing the swap coil and at least part of the driving coil on each other makes it possible to reduce the footprints of the stage device and the exposure apparatus including it.

Although the above-described driving coil DC has a six-layered structure, another structure can be adopted.

Figure 12:
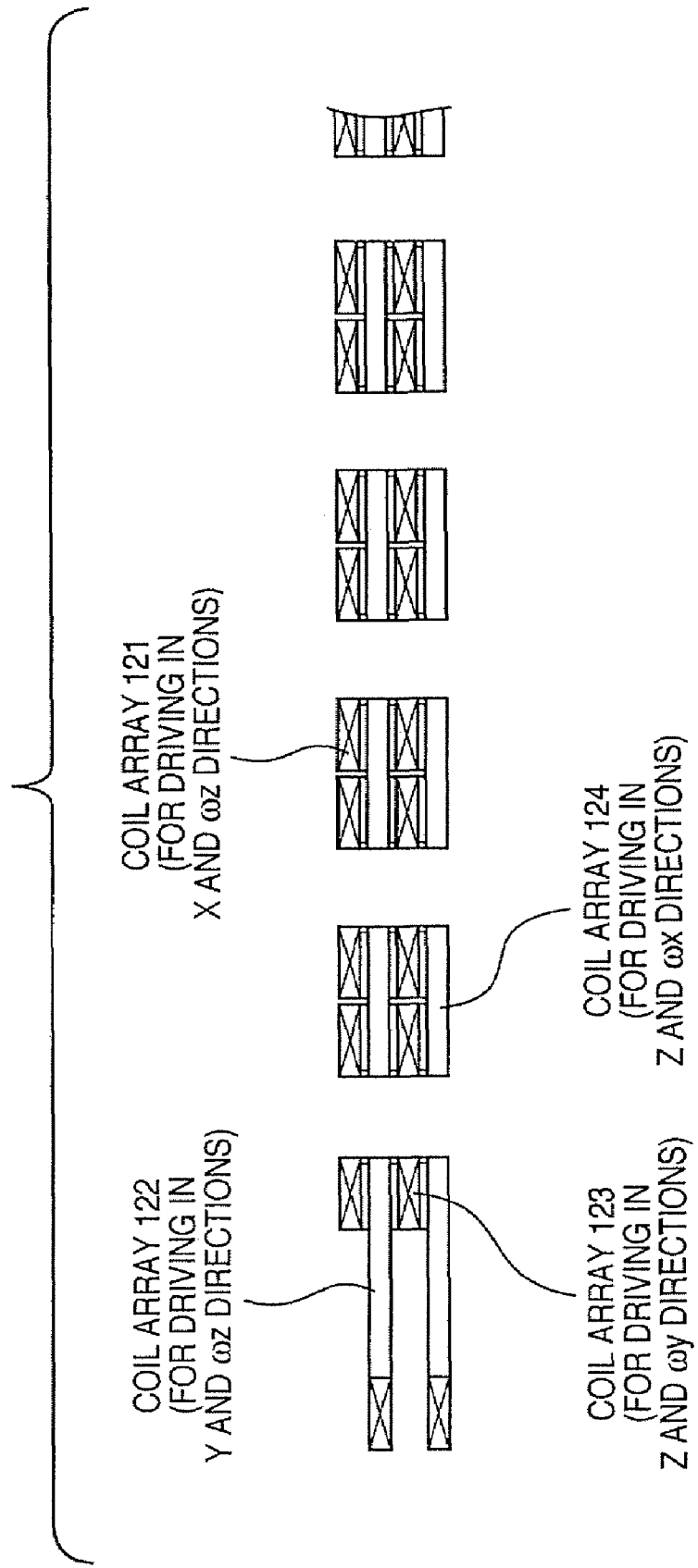
FIG. 12 is a view illustrating a four-layered driving coil.

FIG. 12 is a view illustrating a four-layered driving coil DC. To drive the movable element having the magnet array M as shown in FIGS. 1A, 1B, 4A, and 4B, the driving coil shown in FIG. 12 can be adopted as a substitute for the driving coil DC shown in FIGS. 1A and 1B.

The driving coil DC shown in FIG. 12 has a four-layered structure which comprises two layers including a plurality of almost round shaped rectangular coils having straight portions parallel to the X direction, and two layers including a plurality of almost round shaped rectangular coils having straight portions parallel to the Y direction. The driving coil shown in FIG. 2 separately has layers which generate forces in the directions of six degrees of freedom, while the driving coil shown FIG. 12 has layers each of which generates a force in the directions of two degrees of freedom.

FIG. 13 is a view for explaining driving in the Y and ωz directions. Current control is done to drive coils which face the movable element, using a coil array 122 including a plurality of almost round shaped rectangular coils having straight portions parallel to the X direction, and to cause the upper and lower halves of the movable element to separately generate translational forces. The sum of the force generated by the upper half and the force generated by the lower half serves as a translational force in the Y direction. Since the line of action of the force generated by the upper half and the line of action of the force generated by the lower half are shifted from each other in the X direction, the difference between the force generated by the upper half and the force generated by the lower half serves as a moment in the ωz direction.

FIG. 14 is a view for explaining driving in the Z and ωx directions. Current control is done to drive only coils which face the movable element, using a coil array 124 including a plurality of almost round shaped rectangular coils having straight portions parallel to the X direction, and to cause the upper and lower halves of the movable element to separately generate levitation forces. The sum of the levitation force generated by the upper half and the levitation force generated by the lower half, shown in FIG. 14, serves as a levitation force which acts on the movable element. Since the line of action of the force generated by the upper half and the line of action of the force generated by the lower half are shifted from each other in the Y direction, the difference between the force generated by the upper half and the force generated by the lower half serves as a moment in the ωx direction.

FIG. 15 is a view for explaining driving in the X and ωz directions. Current control is done to drive only coils which face the movable element, using a coil array 121 including a plurality of almost round shaped rectangular coils having straight portions parallel to the Y direction, and to cause the right and left halves of the movable element to separately generate translational forces. The sum of the translational force generated by the right half and the translational force generated by the left half, shown in FIG. 15, serves as a translational force which acts on the movable element. Since the line of action of the force in the X direction generated by the right half and the line of action of the force in the X direction generated by the left half are shifted from each other in the Y direction, the difference between the force generated by the right half and the force generated by the left half serves as a moment in the ωz direction.

FIG. 16 is a view for explaining driving in the Z and ωy directions. Current control is done to drive only coils which face the movable element, using a coil array 123 including a plurality of almost round shaped rectangular coils having straight portions parallel to the Y direction, and to cause the right and left halves of the movable element to separately generate levitation forces. The sum of the levitation force generated by the right half and the levitation force generated by the left half, shown in FIG. 16, serves as a levitation force which acts on the movable element. Since the line of action of the force generated by the right half and the line of action of the force generated by the left half are shifted from each other in the X direction, the difference between the force generated by the right half and the force generated by the left half serves as a moment in the ωy direction.

According to the arrangement example shown in FIG. 12, it is possible to decrease the number of layers of the coil array. According to another aspect, it is possible to increase the sectional area of coils per one layer. It is therefore possible to reduce the resistance of the coils and even decrease the amount of heat generated by the coils.

FIG. 17 is a view illustrating a two-layered driving coil DC. To drive the movable element having the magnet array M as shown in FIGS. 1A, 1B, 4A, and 4B, the driving coil shown in FIG. 17 can be adopted as a substitute for the driving coil DC shown in FIGS. 1A and 1B.

The driving coil DC shown in FIG. 17 has a two-layered structure which comprises a coil array 171 including a plurality of almost round shaped rectangular coils having straight portions parallel to the X direction, and a coil array 172 including a plurality of almost round shaped rectangular coils having straight portions parallel to the Y direction.

As has been described above, coils having straight portions parallel to the X direction can generate a driving force in the Y direction, a driving force in the Z direction, and a moment in the ωx direction. When a current to generate a driving force in the Y direction and a current to generate a moment in the ωx direction are superimposed on each other to cause the straight portions to supply the superimposed current to the coil array 172, it is possible to allow one layer to generate a driving force in the Y direction, a driving force in the Z direction, and a moment in the ωx direction. Similarly, only the coil array 171 including a plurality of coils having straight portions parallel to the Y direction can generate a driving force in the X direction, a driving force in the Z direction, and a moment in the ωy direction.

Figure 19:
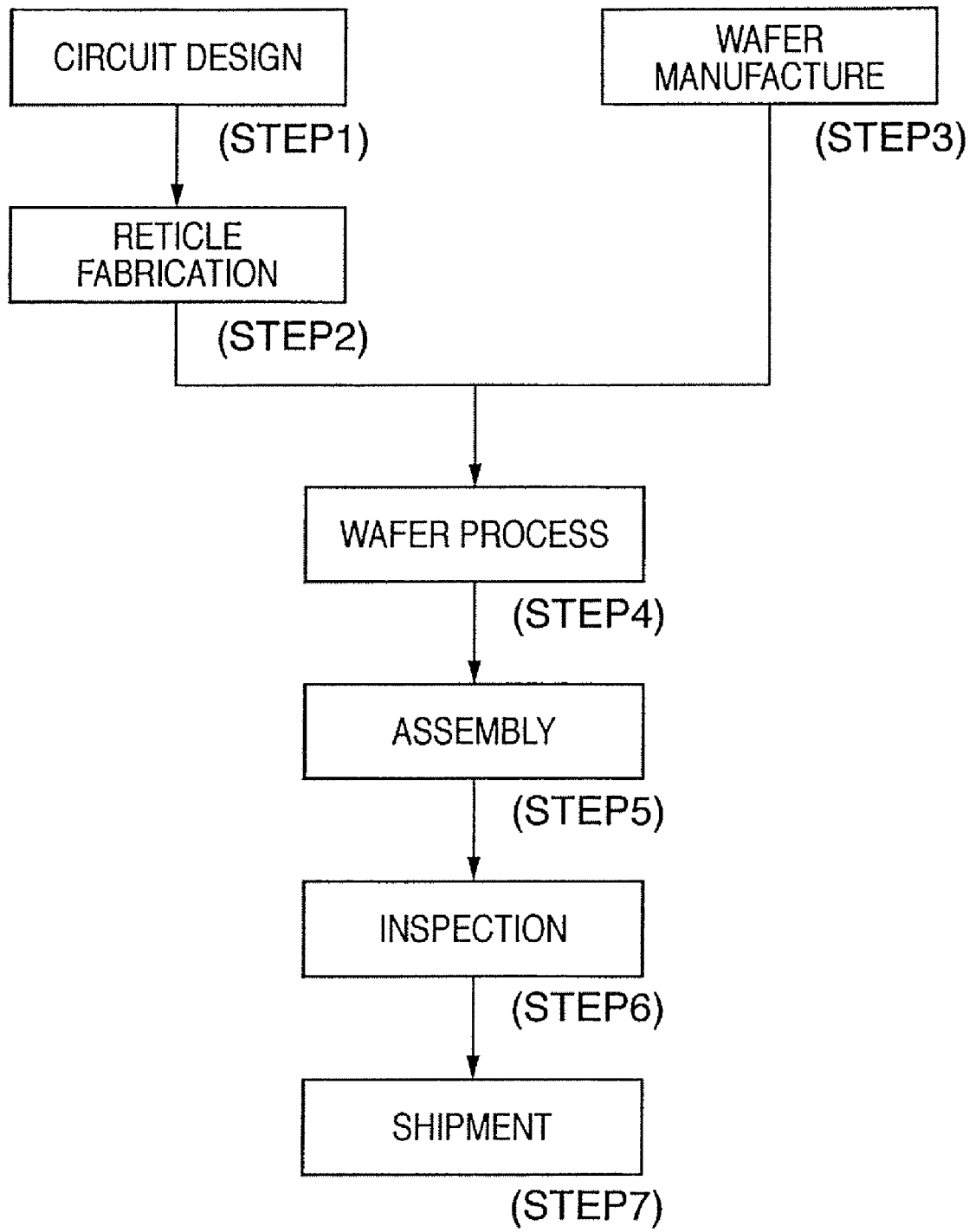
FIG. 19 is a flowchart showing the overall manufacturing process sequence.

A device manufacturing process using the above-described exposure apparatus will be explained next. FIG. 19 is a flowchart showing the sequence of the overall semiconductor device manufacturing process. In step 1 (circuit design), the circuit of a semiconductor device is designed. In step 2 (reticle fabrication), a reticle (original) is fabricated on the basis of the designed circuit pattern. In step 3 (wafer manufacture), a wafer (substrate) is manufactured using a material such as silicon. In step 4 (wafer process) called a preprocess, an actual circuit is formed on the wafer by lithography using the reticle and wafer. In step 5 (assembly) called a post-process, a semiconductor chip is formed from the wafer manufactured in step 4. This step includes processes such as assembly (dicing and bonding) and packaging (chip encapsulation). In step 6 (inspection), inspections including operation check test and durability test of the semiconductor device manufactured in step 5 are performed. A semiconductor device is completed with these processes and shipped in step 7.

Figure 20:
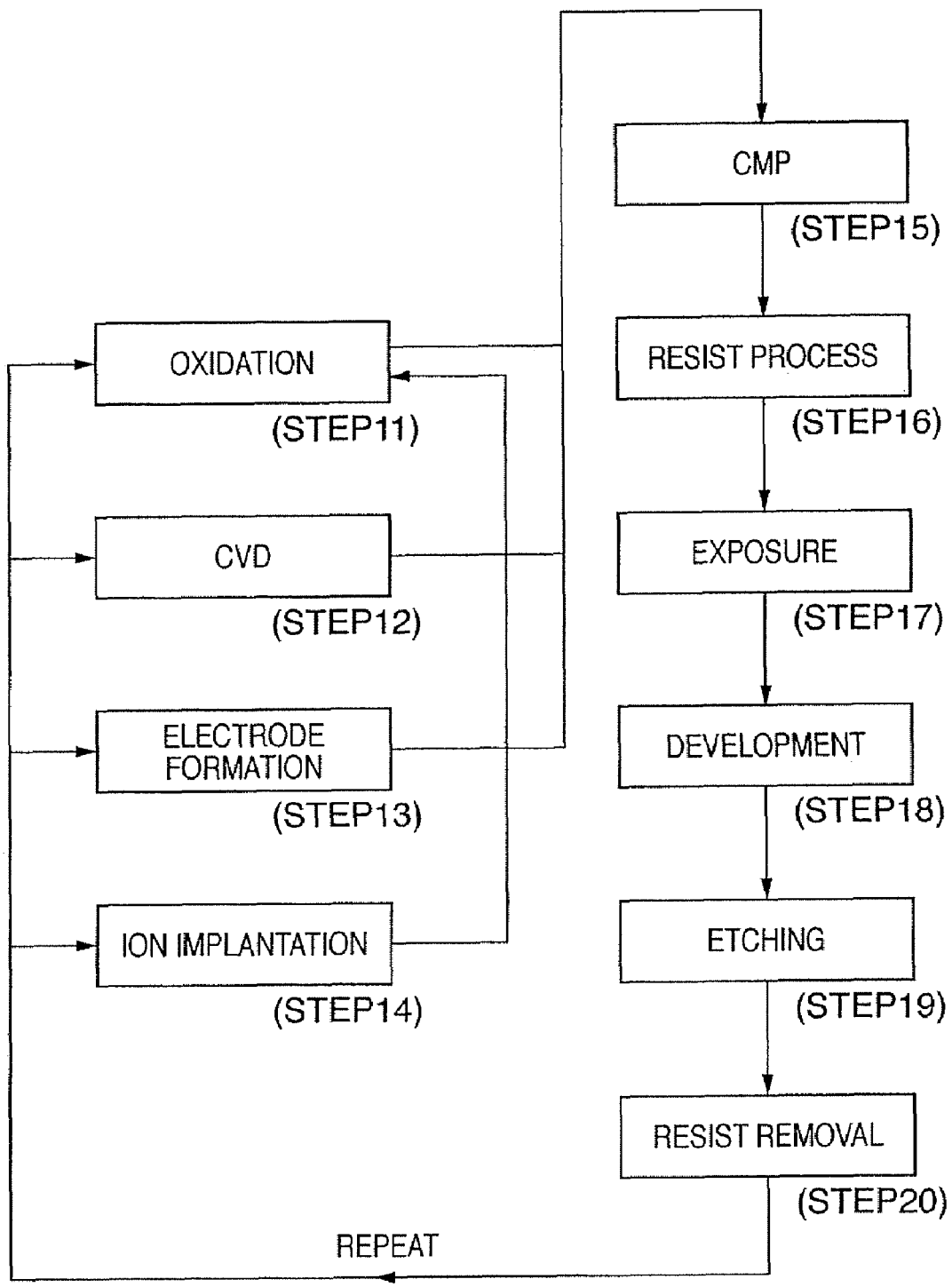
FIG. 20 is a flowchart showing the detailed sequence of the wafer process.

FIG. 20 shows the detailed sequence of the wafer process. In step 11 (oxidation), the surface of the wafer is oxidized. In step 12 (CVD), an insulating film is formed on the wafer surface. In step 13 (electrode formation), an electrode is formed on the wafer by deposition. In step 14 (ion implantation), ions are implanted into the wafer. In step 15 (CMP), the film on the wafer surface is planarized by CMP. In step 16 (resist process), a photosensitive agent is applied to the wafer. In step 17 (exposure), the above-described exposure apparatus transfers the circuit pattern onto the wafer coated with the photosensitive agent to form a latent image pattern. In step 18 (development), the latent image pattern transferred onto the wafer is developed to form a resist pattern. In step 19 (etching), the layer or substrate under the resist pattern is etched through a portion where the resist pattern opens. In step 20 (resist removal), any unnecessary resist remaining after etching is removed. By repeating these steps, a multilayered structure of circuit patterns is formed on the wafer.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2006-139465, filed May 18, 2006, which is hereby incorporated by reference herein in its entirety.

What is claimed is:

1. A driving apparatus which comprises a stator and two movable elements, said stator including a first area and a second area, and said movable elements being capable of moving on said stator,
   said movable elements including magnets,
   said stator including a coil unit,
   said coil unit including a driving coil configured to independently drive said two movable elements when said two movable elements are situated within the first area and the second area, respectively, and a swap coil configured to swap said two movable elements between the first area and the second area, and said coil unit being configured such that said swap coil and at least part of said driving coil are superimposed on each other.

2. The apparatus according to claim 1, wherein said swap coil can drive said two movable elements in opposite directions parallel to a first direction in which the first area and the second area align themselves.

3. The apparatus according to claim 2, wherein said swap coil includes two coil arrays divided in a second direction perpendicular to the first direction, and each coil array is formed by juxtaposing, in the first direction, a plurality of coils including straight portions along the second direction.

4. The apparatus according to claim 1, wherein said swap coil is arranged at a position farther from said movable element than said driving coil.

5. The apparatus according to claim 1, wherein the first area is an area to execute an alignment measurement process for a substrate supported on said movable element, and the second area is an area to execute an exposure process for the substrate while aligning the substrate on the basis of the alignment measurement result.

6. The apparatus according to claim 5, wherein said driving coil is used for a swap process for swapping said two movable elements, in addition to the measurement process and the exposure process.

7. The apparatus according to claim 6, wherein said driving coil is used for a swap process for swapping said two movable elements, in addition to the measurement process and the exposure process.

8. An exposure apparatus which executes an alignment measurement process and an exposure process in parallel, comprising:
   a stage device which comprises a stator and two movable elements, said stator including a measurement area and an exposure area, and said movable elements being capable of moving on said stator and each including a chuck configured to hold a substrate;
   a measurement unit configured to execute the measurement process within the measurement area; and
   an exposure unit configured to execute the exposure process for the substrate within the exposure area while aligning the substrate on the basis of the measurement result obtained by said measurement unit,
   said movable elements including magnets,
   said stator including a coil unit,
   said coil unit including a driving coil configured to independently drive said two movable elements within the measurement area and the exposure area, and a swap coil configured to swap said two movable elements between the measurement area and the exposure area, and said coil unit being configured such that said swap coil and at least part of said driving coil are superimposed on each other.

9. The apparatus according to claim 8, wherein said swap coil can drive said two movable elements in opposite directions parallel to a first direction in which the alignment area and the exposure area align themselves.

10. The apparatus according to claim 9, wherein said swap coil includes two coil arrays divided in a second direction perpendicular to the first direction, and each coil array is formed by juxtaposing, in the first direction, a plurality of coils including straight portions along the second direction.

11. The apparatus according to claim 8, wherein said swap coil is arranged at a position farther from said movable element than said driving coil.

12. A method of manufacturing a device, comprising steps of:

exposing a photosensitive agent applied to a substrate using an exposure apparatus defined in claim 8;

developing the photosensitive agent; and processing the substrate.

* * * * *